United States Patent
Kim

(10) Patent No.: US 10,084,009 B2
(45) Date of Patent: Sep. 25, 2018

(54) LIGHT-EMITTING DIODE STRUCTURE INCLUDING SEPARATION UNIT BETWEEN LIGHT-EMITTING DIODE UNITS AND DISPLAY APPARATUS INCLUDING THE SAME

(71) Applicant: SAMSUNG DISPLAY CO., LTD., Yongin-si, Gyeonggi-do (KR)

(72) Inventor: Minsoo Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 9 days.

(21) Appl. No.: 15/150,682

(22) Filed: May 10, 2016

(65) Prior Publication Data

US 2017/0062515 A1  Mar. 2, 2017

(30) Foreign Application Priority Data

Aug. 31, 2015  (KR) .................. 10-2015-0122873

(51) Int. Cl.
*H01L 27/32* (2006.01)
*H01L 27/15* (2006.01)
(Continued)

(52) U.S. Cl.
CPC .............. *H01L 27/15* (2013.01); *H01L 33/06* (2013.01); *H01L 33/32* (2013.01); *H01L 33/44* (2013.01);
(Continued)

(58) Field of Classification Search
CPC . H01L 27/32; H01L 27/3202; H01L 27/3204; H01L 27/3211; H01L 27/3251
See application file for complete search history.

(56) References Cited

U.S. PATENT DOCUMENTS

2006/0110839 A1  5/2006  Dawson et al.
2009/0137074 A1  5/2009  Lee et al.
(Continued)

FOREIGN PATENT DOCUMENTS

KR      100874458 B1   12/2008

OTHER PUBLICATIONS

European Extended Search Report for application No. 16180624.5 dated Sep. 9, 2016.

*Primary Examiner* — Hoai V Pham
(74) *Attorney, Agent, or Firm* — Cantor Colburn LLP

(57) ABSTRACT

A light-emitting diode structure includes light-emitting diode units, and a separation unit, where one of the light-emitting diode units includes a stacked structure including an n-type semiconductor layer, a p-type semiconductor layer, and a photo-active layer arranged between the n-type semiconductor layer and the p-type semiconductor layer, a first electrode, which faces a surface of the stacked structure and is electrically connected to one of the n-type semiconductor layer and the p-type semiconductor layer, and a second electrode, which faces the surface of the stacked structure opposite to the surface faced by the first electrode and is electrically connected to one of the n-type semiconductor layer and the p-type semiconductor layer, and the separation unit is arranged between at least two adjacent light-emitting diode units among the light-emitting diode units and separates the two light-emitting diode units from each other.

18 Claims, 29 Drawing Sheets

(51) Int. Cl.
*H01L 33/44*   (2010.01)
*H01L 33/06*   (2010.01)
*H01L 33/32*   (2010.01)
*H01L 33/58*   (2010.01)
*H01L 33/60*   (2010.01)
H01L 25/075   (2006.01)
H01L 33/20    (2010.01)

(52) U.S. Cl.
CPC .............. *H01L 33/58* (2013.01); *H01L 33/60* (2013.01); *H01L 25/0753* (2013.01); *H01L 27/156* (2013.01); *H01L 33/20* (2013.01)

(56) References Cited

U.S. PATENT DOCUMENTS

| | | |
|---|---|---|
| 2012/0119237 A1 | 5/2012 | Leatherdale et al. |
| 2012/0168776 A1 | 7/2012 | Nakamura et al. |
| 2014/0064904 A1 | 3/2014 | Bibl et al. |
| 2014/0159043 A1 | 6/2014 | Sakariya et al. |
| 2014/0367705 A1 | 12/2014 | Bibl et al. |
| 2015/0054008 A1 | 2/2015 | Rhee |
| 2015/0076528 A1 | 3/2015 | Chan et al. |
| 2015/0221619 A1 | 8/2015 | Rhee |
| 2016/0322000 A1* | 11/2016 | Kim .................... G09G 3/2003 |
| 2016/0359142 A1* | 12/2016 | Huangfu ................. H01L 27/32 |

* cited by examiner

LIGHT-EMITTING DIODE STRUCTURE INCLUDING SEPARATION UNIT BETWEEN LIGHT-EMITTING DIODE UNITS AND DISPLAY APPARATUS INCLUDING THE SAME

This application claims priority to Korean Patent Application No. 10-2015-0122873, filed on Aug. 31, 2015, and all the benefits accruing therefrom under 35 U.S.C. § 119, the content of which in its entirety is herein incorporated by reference.

BACKGROUND

1. Field

One or more exemplary embodiments relate to a light-emitting diode structure and a display apparatus.

2. Description of the Related Art

Recently, display apparatuses have been used for various purposes. Furthermore, display apparatuses are widely used according to a technological development such as a reduction of the thicknesses and weights thereof.

Particularly, display apparatuses are lately being widely researched and manufactured as flat-panel display apparatuses.

Since a display apparatus may be formed as a flat-panel display apparatus, various methods may be used to design a display apparatus, which may thereby provide more and more functions.

Incidentally, a light-emitting diode ("LED"), which is a semiconductor element having a relatively simple structure, is used for various purposes in the design of a display apparatus.

SUMMARY

A single LED is very small, and there are limits to an operation for fabricating such a LED to a desired shape and embodying a LED with high light efficiency.

Furthermore, there are limits to improving light efficiency and manufacturing characteristics, such as precise patterning, of a display apparatus using the same.

One or more exemplary embodiments include light-emitting diode structures with improved light characteristics, image quality characteristics, and manufacturing convenience and display apparatuses including the same.

Additional exemplary embodiments will be set forth in part in the description which follows and, in part, will be apparent from the description, or may be learned by practice of the presented embodiments.

According to one or more exemplary embodiments, a light-emitting diode structure includes a plurality of light-emitting diode units, and a separating unit, wherein at least one of the plurality of light-emitting diode units includes a stacked structure including an n-type semiconductor layer, a p-type semiconductor layer, and a photo-active layer arranged between the n-type semiconductor layer and the p-type semiconductor layer, a first electrode, which is arranged to face a surface of the stacked structure and is electrically connected to one of the n-type semiconductor layer and the p-type semiconductor layer, and a second electrode, which is arranged to face the surface of the stacked structure opposite to the surface faced by the first electrode and is electrically connected to one of the n-type semiconductor layer and the p-type semiconductor layer, and the separating unit is arranged between at least two light-emitting diode units adjacent to each other among the plurality of light-emitting diode units and separates the two light-emitting diode units from each other.

In an exemplary embodiment, the plurality of light-emitting diode units may emit light from one or more side surfaces among a plurality of side surfaces arranged between the first electrode and the second electrode.

In an exemplary embodiment, the two light-emitting diode units adjacent to each other among the plurality of light-emitting diode units may be adjacent to each other at least in a first direction, and the light-emitting diode structure may emit light from side surfaces facing the first direction or a second direction crossing the first direction among the plurality of side surfaces arranged between the first electrode and the second electrode.

In an exemplary embodiment, the separating unit may further include one or more partitioning walls corresponding to at least one side surface among side surfaces of the plurality of light-emitting diode structure.

In an exemplary embodiment, the plurality of light-emitting diode units may further include two light-emitting diode units adjacent to each other in a first direction and two light-emitting diode units adjacent to each other in a direction crossing the first direction.

According to one or more exemplary embodiments, a display apparatus includes a plurality of pixels, and one or more light-emitting diode structures, wherein any one of the one or more light-emitting diode structures is arranged in correspondence at least to the plurality of pixels adjacent to one another, any one of the one or more light-emitting diode structures includes a plurality of light-emitting diode units and a separating unit, each of the plurality of light-emitting diode units includes a stacked structure including an n-type semiconductor layer, a p-type semiconductor layer, and a photo-active layer arranged between the n-type semiconductor layer and the p-type semiconductor layer, a first electrode, which faces a surface of the stacked structure and is electrically connected to one of the n-type semiconductor layer and the p-type semiconductor layer, and a second electrode, which faces the surface of the stacked structure opposite to the surface faced by the first electrode and is electrically connected to one of the n-type semiconductor layer and the p-type semiconductor layer, and the separating unit is arranged between at least two light-emitting diode units adjacent to each other among the plurality of light-emitting diode units and separates the two light-emitting diode units from each other.

In an exemplary embodiment, the plurality of light-emitting diode units may be arranged in correspondence to the plurality of pixels adjacent to one another, respectively.

In an exemplary embodiment, the plurality of light-emitting diode units of the light-emitting diode structure may include at least two light-emitting diode units adjacent to each other in a first direction, and two pixels among the plurality of pixels corresponding to the light-emitting diode units adjacent to each other in the first direction may be adjacent to each other in the first direction.

In an exemplary embodiment, the plurality of light-emitting diode units of the light-emitting diode structure may include light-emitting diode units adjacent to each other in the first direction, and pixels among the plurality of pixels corresponding to the light-emitting diode units adjacent to each other in the first direction may be adjacent to each other in a second direction crossing the first direction.

In an exemplary embodiment, each of the plurality of pixels may include at least one thin-film transistor, and each of the light-emitting diode units of the light-emitting diode structure may be electrically connected to the thin-film transistor.

In an exemplary embodiment, each of the plurality of pixels may include a pixel electrode that electrically interconnects the thin-film transistor and each of the light-emitting diode unit of the light-emitting diode structure and a counter electrode electrically connected to each of the light-emitting diodes of the light-emitting diode structure.

In an exemplary embodiment, the display apparatus may further include a reflective layer, which is arranged in correspondence to the plurality of pixels and reflects light emitted by the light-emitting diode units.

In an exemplary embodiment, the reflective layer may include a sloped reflective layer.

In an exemplary embodiment, the display apparatus may further include a pixel-defining layer, in which an opening corresponding to the plurality of pixels is defined and which includes an insulation material.

In an exemplary embodiment, the opening of the pixel-defining layer may be arranged at least in correspondence to the plurality of pixels, and the light-emitting diode structure may be arranged in correspondence to the opening.

In an exemplary embodiment, the display apparatus further may include a light controlling member, which is arranged in correspondence to the plurality of pixels and controls light emitted by the light-emitting diode units.

In an exemplary embodiment, the plurality of light-emitting diode units may further include two light-emitting diode units adjacent to each other in a first direction and two light-emitting diode units adjacent to each other in a second direction crossing the first direction, and the plurality of pixels include two pixels, which correspond to the two light-emitting diode units adjacent to each other in the first direction and are adjacent to each other, and two pixels, which correspond to the two light-emitting diode units adjacent to each other in the second direction and are adjacent to each other.

In an exemplary embodiment, the plurality of light-emitting diode units may emit light from one or more side surfaces among a plurality of side surfaces arranged between the first electrode and the second electrode.

In an exemplary embodiment, two light-emitting diode units adjacent to each other among the plurality of light-emitting diode units may be adjacent to each other at least in a first direction, and the light-emitting diode units may emit light from side surfaces facing the first direction or a second direction crossing the first direction among the plurality of side surfaces arranged between the first electrode and the second electrode.

In an exemplary embodiment, the separating unit may further include one or more partitioning walls corresponding to at least one side surface among side surfaces of the plurality of light-emitting diode structure.

BRIEF DESCRIPTION OF THE DRAWINGS

These and/or other exemplary embodiments will become apparent and more readily appreciated from the following description of the exemplary embodiments, taken in conjunction with the accompanying drawings in which.

DETAILED DESCRIPTION

Figure 1:
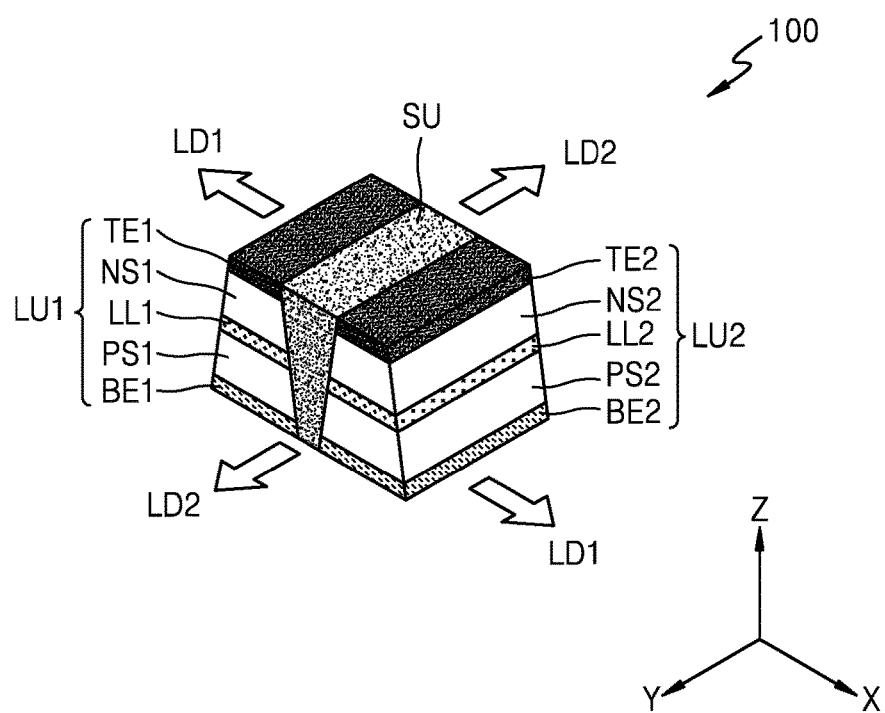
FIG. 1 is a perspective view illustrating an exemplary embodiment of a light-emitting diode structure according to the invention.

As the invention allows for various changes and numerous embodiments, particular embodiments will be illustrated in the drawings and described in detail in the written description. However, this is not intended to limit the invention to particular modes of practice, and it is to be appreciated that all changes, equivalents, and substitutes that do not depart from the spirit and technical scope of the invention are encompassed in the invention. In the description of the invention, certain detailed explanations of the related art are omitted when it is deemed that they may unnecessarily obscure the essence of the invention.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "on" another layer, region, or component, it can be directly or indirectly on the other layer, region, or component. That is, for example, intervening layers, regions, or components may be present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an exemplary embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). In an exemplary embodiment, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an exemplary embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Sizes of elements in the drawings may be exaggerated for convenience of explanation. In other words, since sizes and thicknesses of components in the drawings are arbitrarily illustrated for convenience of explanation, the following embodiments are not limited thereto.

In the following examples, the x-axis, the y-axis and the z-axis are not limited to three axes of the rectangular coordinate system, and may be interpreted in a broader sense. In an exemplary embodiment, the x-axis, the y-axis, and the z-axis may be perpendicular to one another, or may represent different directions that are not perpendicular to one another, for example.

When a certain embodiment may be implemented differently, a specific process order may be performed differently from the described order. In an exemplary embodiment, two consecutively described processes may be performed substantially at the same time or performed in an order opposite to the described order, for example.

Reference will now be made in detail to exemplary embodiments, examples of which are illustrated in the accompanying drawings, wherein like reference numerals refer to like elements throughout. In this regard, the exemplary embodiments may have different forms and should not be construed as being limited to the descriptions set forth herein. Accordingly, the exemplary embodiments are merely described below, by referring to the figures, to explain exemplary embodiments of the description.

FIG. 1 is a perspective view illustrating a light-emitting diode structure according to an exemplary embodiment.

Referring to FIG. 1, a light-emitting diode structure 100 according to an exemplary embodiment includes a plurality of light-emitting diode units LU1 and LU2 and a separation unit SU. In other words, although FIG. 1 shows two light-emitting diode units, the light-emitting diode structure 100 may also include three or more light-emitting diode units.

The light-emitting diode units LU1 and LU2 include a first light-emitting diode unit LU1 and a second light-emitting diode unit LU2.

The separation unit SU is arranged between the two light-emitting diode units LU1 and LU2 adjacent to each other. In other words, the separation unit SU may be arranged between the first light-emitting diode unit LU1 and the second light-emitting diode unit LU2 and separates the first light-emitting diode unit LU1 and the second light-emitting diode unit LU2 from each other.

According to an exemplary embodiment, the separation unit SU may insulate the first light-emitting diode unit LU1 and the second light-emitting diode unit LU2 from each other. To this end, the separation unit SU may include an insulation material.

Furthermore, according to an exemplary embodiment, the separation unit SU may include a material with low photo-transmissivity so as to reduce or block light transmissions between the first light-emitting diode unit LU1 and the second light-emitting diode unit LU2. In an exemplary embodiment, the separation unit SU may include a black matrix ("BM"), for example.

Descriptions of the first light-emitting diode unit LU1 and the second light-emitting diode unit LU2 will be given below.

The first light-emitting diode unit LU1 includes a stacked structure including an n-type semiconductor layer NS1, a p-type semiconductor layer PS1, a photo-active layer LL1, a first electrode BE1, and a second electrode TE1.

The n-type semiconductor layer NS1 may include any of various materials and may include a nitride-based semiconductor material, for example.

According to an exemplary embodiment, the n-type semiconductor layer NS1 may include an n-type Group III nitride-based semiconductor material. In an exemplary embodiment, the n-type semiconductor layer NS1 may include a GaN-based material. More particularly, the n-type semiconductor layer NS1 may include $Al_xGa_yIn_zN$ ($0 \leq x, y, z \leq 1$), for example.

Furthermore, according to another exemplary embodiment, the n-type semiconductor layer NS1 may include an n-type Group III nitride-based semiconductor material, such as InGaN, GaN, AlInN, AlN, InN, or AlGaN, may include a nitride-based layer having an nitrogen-polar surface, and may also include a super lattice structure layer including the above-stated materials.

The p-type semiconductor layer PS1 may include any of various materials and may include a nitride-based semiconductor material, for example.

According to an exemplary embodiment, the p-type semiconductor layer PS1 may include an p-type Group III nitride-based semiconductor material. In an exemplary embodiment, the p-type semiconductor layer PS1 may include a GaN-based material. More particularly, the p-type semiconductor layer PS1 may include $Al_xGa_yIn_zN$ ($0 \leq x, y, z \leq 1$), for example.

In an exemplary embodiment, for example, the p-type semiconductor layer PS1 may include a GaN-based material and may be provided by implanting an Mg or Zn-containing material thereto.

The photo-active layer LL1 may include various materials and may include a single or multi quantum well structure. In an exemplary embodiment, the photo-active layer LL1 may include a GaN-based material, that is, p-type $Al_xGa_yIn_zN$ ($0 \leq x, y, z \leq 1$) and may have a single (or multi) quantum well structure including at least one barrier layer and at least one well layer, for example.

The above-stated materials constituting the n-type semiconductor layer NS1, the n-type semiconductor layer NS2, and the photo-active layer LL1 are merely examples, and the exemplary embodiment is not limited thereto, where various other materials may be selectively used.

Furthermore, the n-type semiconductor layer NS1 and the p-type semiconductor layer PS1 may be stacked in reversed order.

The first electrode BE1 is arranged below the p-type semiconductor layer PS1 to be electrically connected to the p-type semiconductor layer PS1. In an exemplary embodiment, the first electrode BE1 may contact the p-type semiconductor layer PS1, for example.

The second electrode TE1 is arranged above the n-type semiconductor layer NS1 to be electrically connected to the n-type semiconductor layer NS1. In an exemplary embodiment, the second electrode TE1 may contact the n-type semiconductor layer NS1, for example.

The second light-emitting diode unit LU2 includes a stacked structure including the n-type semiconductor layer NS2, a p-type semiconductor layer PS2, a photo-active layer LL2, a first electrode BE2, and a second electrode TE2.

Since the n-type semiconductor layer NS2, the p-type semiconductor layer PS2, the photo-active layer LL2, the first electrode BE2, and the second electrode TE2 of the second light-emitting diode unit LU2 may include same materials as the n-type semiconductor layer NS1, the p-type semiconductor layer PS1, the photo-active layer LL2, the first electrode BE1, and the second electrode TE1 of the first light-emitting diode unit LU1, detailed descriptions thereof will be omitted.

In the light-emitting diode structure 100 according to the exemplary embodiment, the first light-emitting diode unit LU1 and the second light-emitting diode unit LU2 are adjacent to each other in a first direction (the x-axis direction in FIG. 1) and the separation unit SU is arranged therebetween.

In the light-emitting diode structure 100, light may be emitted from surfaces facing the first direction among surfaces of the first light-emitting diode unit LU1 and the second light-emitting diode unit LU2. Furthermore, although light are emitted from surfaces facing a second direction (the y-axis direction in FIG. 1) that crosses the first direction (the x-axis direction in FIG. 1), the amount of light emitted from the surfaces facing the second direction (the y-axis direction in FIG. 1) may be smaller than the amount of light emitted from the surfaces facing the first direction (the x-axis direction in FIG. 1).

Here, the first light-emitting diode unit LU1 and the second light-emitting diode unit LU2 may emit light of a same type.

Furthermore, according to an exemplary embodiment, the first light-emitting diode unit LU1 and the second light-emitting diode unit LU2 may emit light of different types. In other words, the first light-emitting diode unit LU1 and the second light-emitting diode unit LU2 may emit light of different types by controlling doping to the photo-active layer LL1 and the photo-active layer LL2.

In other words, to this end, the first light-emitting diode unit LU1 and the second light-emitting diode unit LU2 have side surfaces between the first electrodes BE1 and BE2 and the second electrodes TE1 and TE2, where side surfaces facing the first direction (the x-axis direction) may be larger than the other side surfaces, e.g., side surfaces facing the second direction (the y-axis direction) that crosses the first direction.

Therefore, the amount of light extracted in a first light extracting direction LD1 may be greater than the amount of light extracted in a second light extracting direction LD2.

Therefore, the light-emitting diode structure 100 may easily emit light in the first direction (the x-axis direction) and a direction opposite thereto.

According to an exemplary embodiment, the side surfaces of the first light-emitting diode unit LU1 and the second light-emitting diode unit LU2 facing the first direction (the x-axis direction) may be provided as sloped surfaces.

In other words, in the light-emitting diode structure 100, surfaces facing the first electrodes BE1 and BE2 may be larger than surfaces facing the second electrodes TE1 and TE2.

In an exemplary embodiment, a surface of the first electrode BE1 of the first light-emitting diode unit LU1 may be larger than that of the second electrode TE1. In the same regard, a surface of the first electrode BE2 of the second light-emitting diode unit LU2 may be larger than that of the second electrode TE2.

Therefore, when the light-emitting diode structure 100 is arranged at another member, the light-emitting diode structure 100 may be arranged, such that the first electrodes BE1 and BE2 face downward. As a result, the light-emitting diode structure 100 may be stably arranged.

A surface of the separation unit SU adjacent to the first electrodes BE1 and BE2 may be smaller than a surface of the separation unit SU adjacent to the second electrodes TE1 and TE2. Therefore, the separation unit SU may effectively separate the first light-emitting diode unit LU1 and the second light-emitting diode unit LU2 from each other and prevent destruction of or damage to the separation unit SU, thereby reducing or preventing the first light-emitting diode unit LU1 and the second light-emitting diode unit LU2 from contacting each other or interference between light from the first light-emitting diode unit LU1 and the second light-emitting diode unit LU2.

FIGS. 2A to 2E are schematic diagrams showing a process for fabricating the light-emitting diode structure 100 of FIG. 1.

Figure 2A:
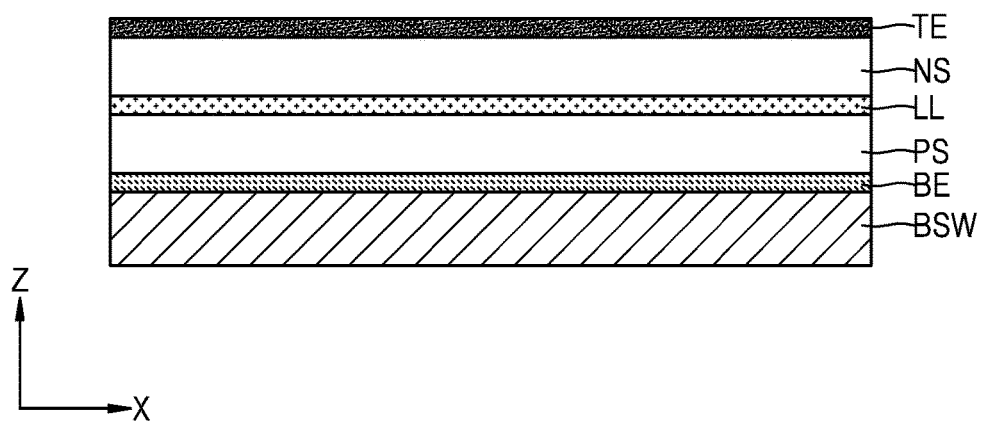
FIGS. 2A to 2E are schematic diagrams showing a process for fabricating the light-emitting diode structure of FIG. 1.

First, referring to FIG. 2A, a first electrode material layer BE, a p-type semiconductor material layer PS, a photo active material layer LL, an n-type semiconductor material layer NS, and a second electrode material layer TE are disposed on a base member BSW.

The first electrode material layer BE, the p-type semiconductor material layer PS, the photo active material layer LL, the n-type semiconductor material layer NS, and the second electrode material layer TE include same materials as the n-type semiconductor layer NS1, the p-type semiconductor layer PS1, the photo-active layer LL1, the first electrode BE1, and the second electrode TE1 described above, and thus detailed descriptions thereof will be omitted.

The base member BSW is provided for fabrication convenience during the fabrication process and may include various materials.

According to an exemplary embodiment, the base member BSW may be a wafer, and more particularly, a wafer including one or more layers.

Figure 2B:
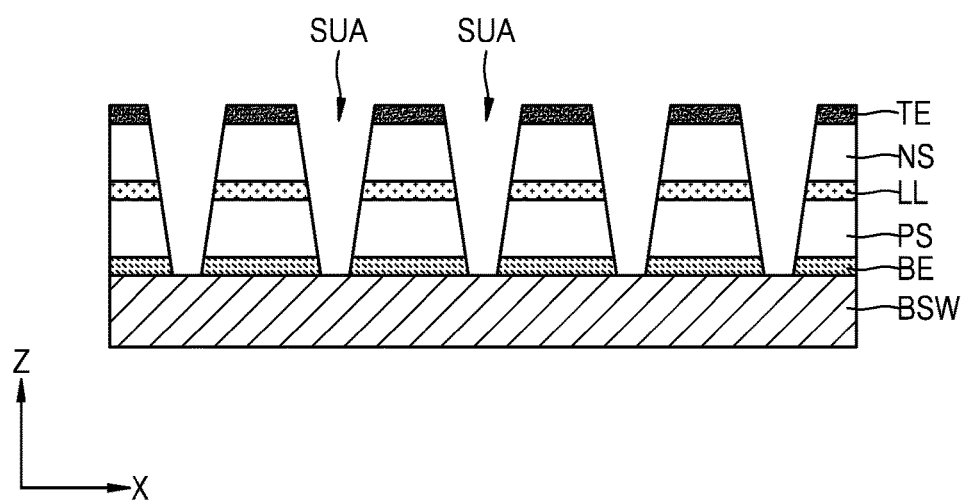

Next, referring to FIG. 2B, a separating region SUA is provided with respect to the first electrode material layer BE, the p-type semiconductor material layer PS, the photo active material layer LL, the n-type semiconductor material layer NS, and the second electrode material layer TE.

The separating region SUA may be provided by using various methods. In an exemplary embodiment, the separating region SUA may be provided by performing a patterning operation, such as a photolithography operation.

Figure 2C:
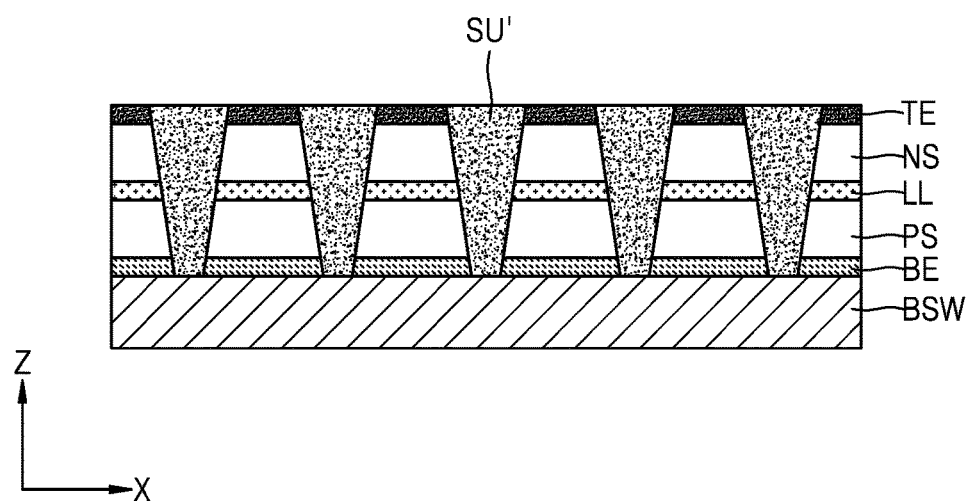

Next, referring to FIG. 2C, a separation unit material SU' may be provided at the separating region SUA. In detail, the separation unit material SU' may fill the separating region SUA.

Figure 2D:
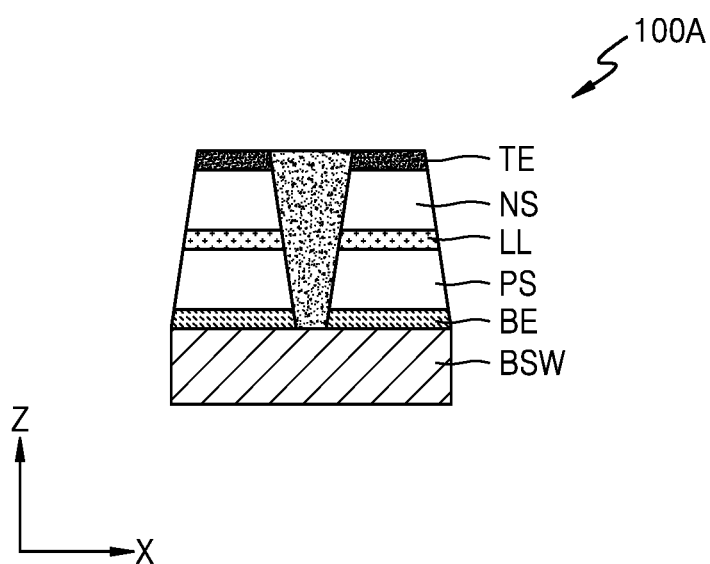

Next, referring to FIG. 2D, a preparatory light-emitting diode structure 100A is provided by cutting the base member BSW, the first electrode material layer BE, the p-type semiconductor material layer PS, the photo active material layer LL, the n-type semiconductor material layer NS, and the second electrode material layer TE.

Figure 2E:
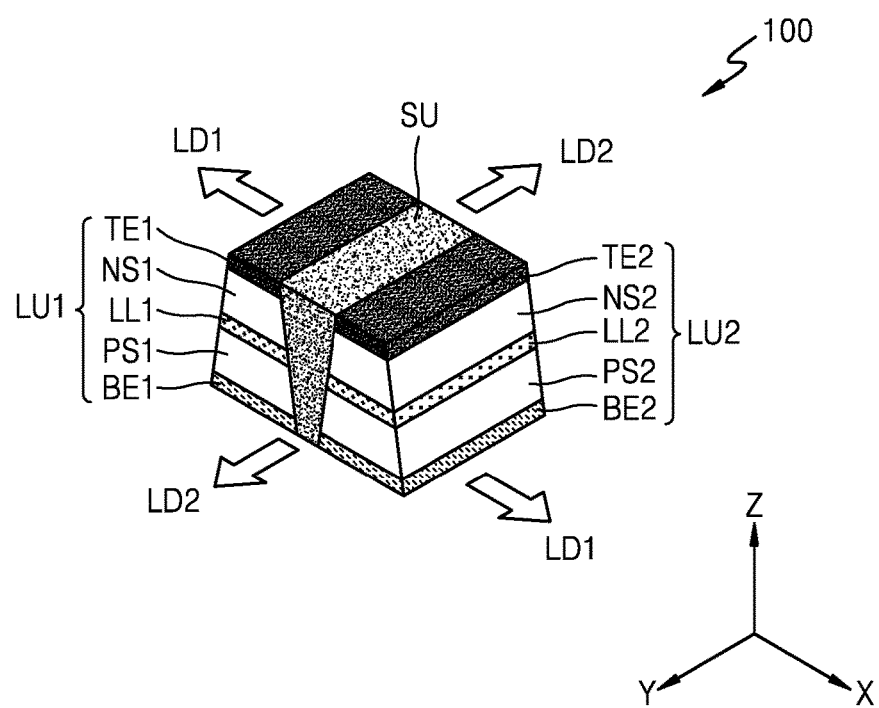

Next, referring to FIG. 2E, the light-emitting diode structure 100 of FIG. 1 is provided by removing the base member BSW.

FIGS. 2A to 2E show an example of forming the light-emitting diode structure 100 of FIG. 1. However, the light-emitting diode structure 100 of FIG. 1 may be provided otherwise.

In other words, the base member BSW may be removed in a different order. In another example, the light-emitting diode structure 100 of FIG. 1 may be provided without the base member BSW.

Furthermore, according to an exemplary embodiment, the first light-emitting diode units LU1 and LU2 may be independently provided and combined with each other via the separation unit SU.

Figure 3:
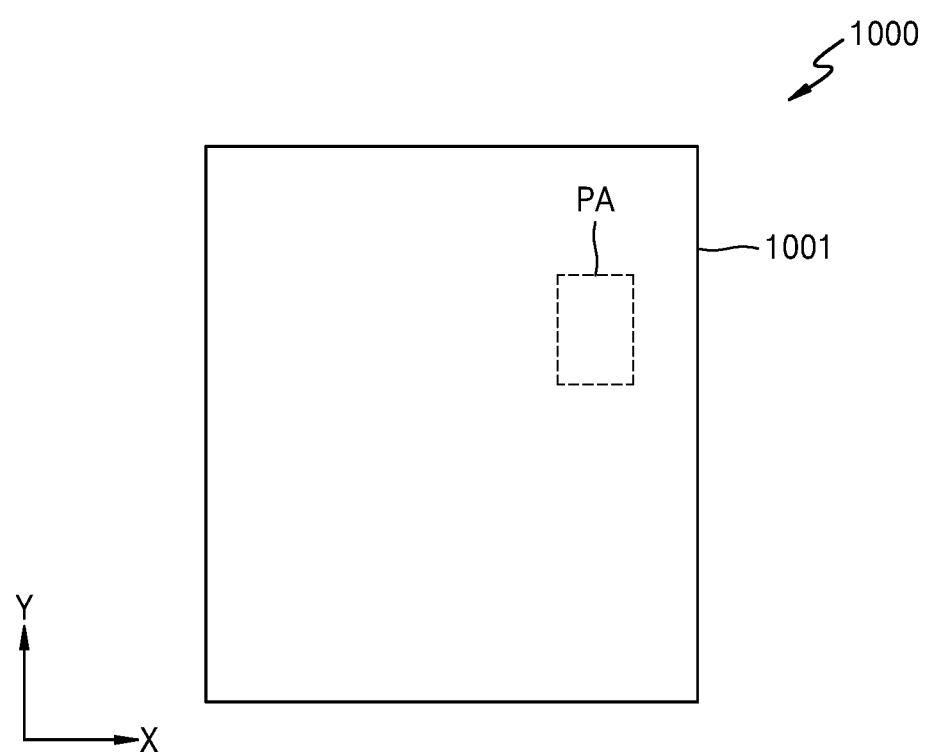
FIG. 3 is a plan view of an exemplary embodiment of a display apparatus according to the invention.
Figure 4:
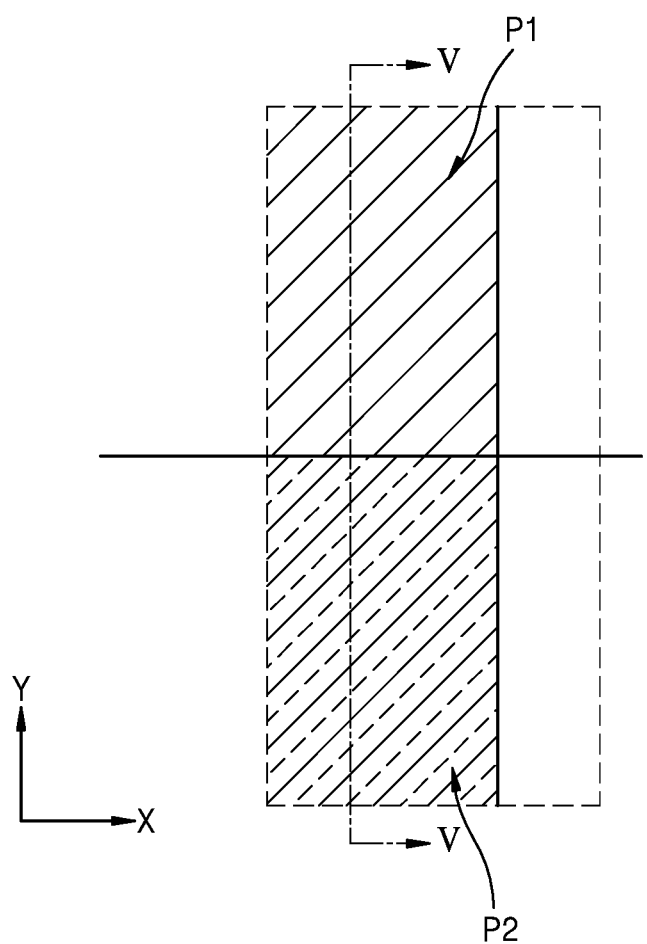
FIG. 4 is a diagram showing PA of FIG. 3 in closer detail.
Figure 5:
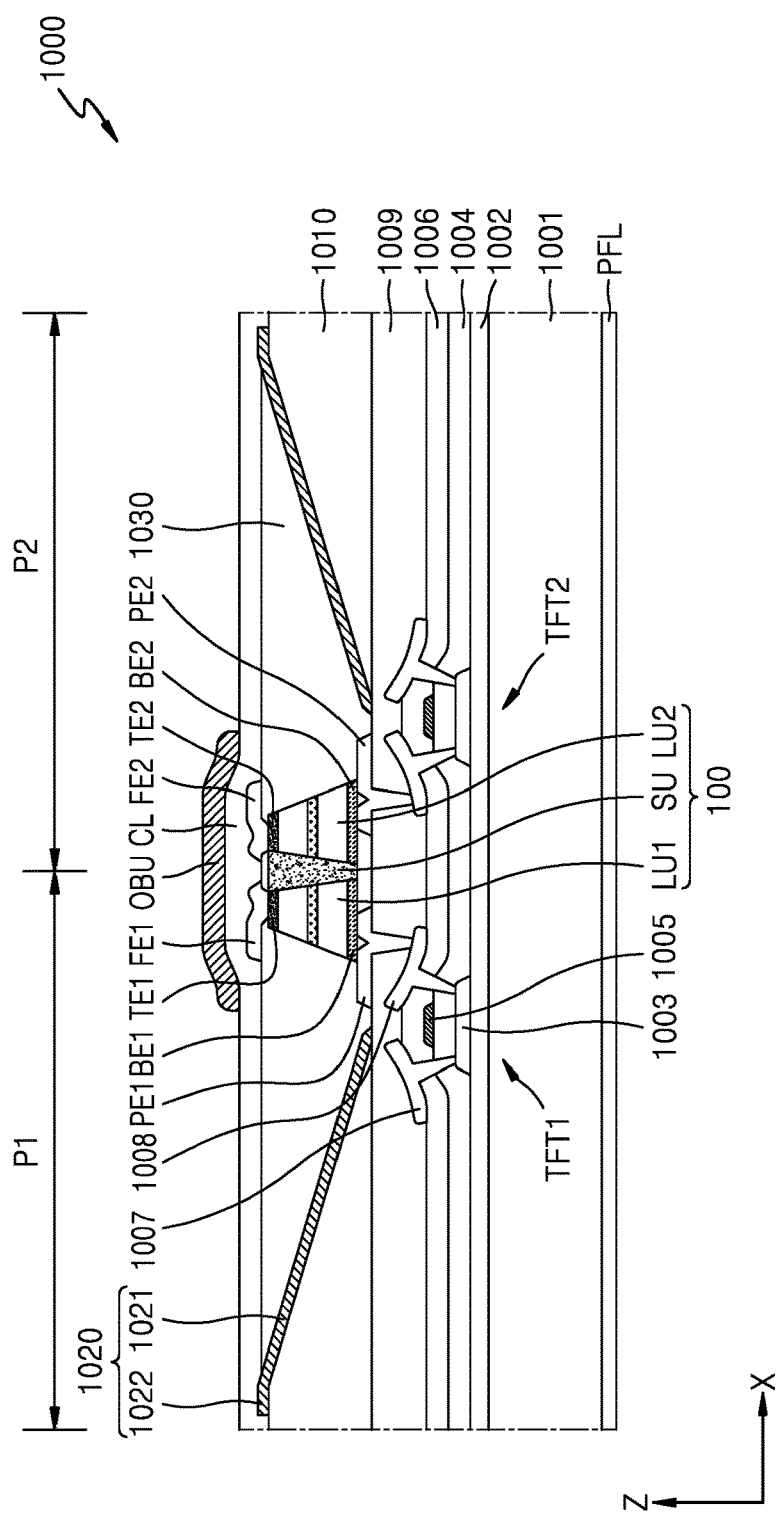
FIG. 5 is a sectional view that is obtained along line V-V of FIG. 4.
Figure 6:
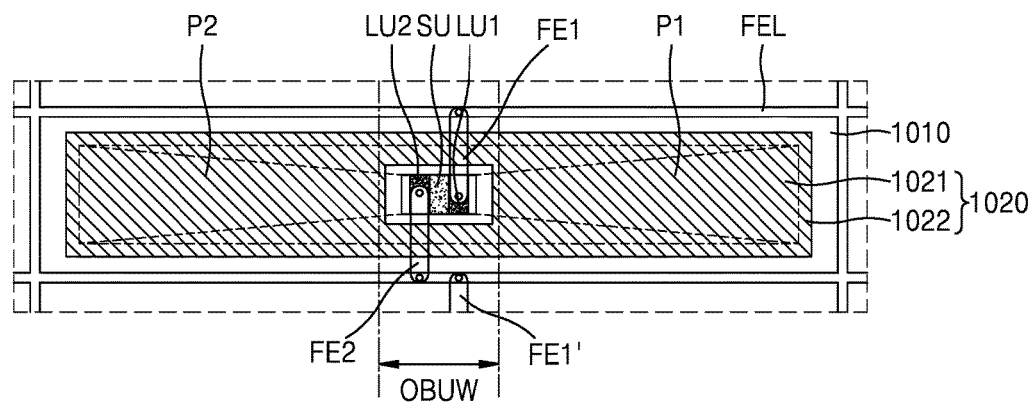
FIG. 6 is a plan view for describing the light-emitting diode structure and a reflective layer of FIG. 5.

FIG. 3 is a plan view of a display apparatus according to an exemplary embodiment, FIG. 4 is a diagram showing PA of FIG. 3 in closer detail, FIG. 5 is a sectional view that is obtained along line V-V of FIG. 4, and FIG. 6 is a plan view for describing a light-emitting diode structure 100 and a reflective layer 1020 of FIG. 5.

A display apparatus 1000 according to the exemplary embodiment includes a plurality of pixels P (refer to FIG. 14) arranged on a substrate 1001. A user may recognize one or more images via the pixels P.

Furthermore, the display apparatus 1000 may include the pixels P and one or more light-emitting diode structures 100.

Since the light-emitting diode structure 100 is identical to the light-emitting diode structure 100 of FIG. 1, as described above, detailed descriptions thereof will be omitted.

FIGS. 4 to 6 show two adjacent pixels P1 and P2 for convenience of explanation.

A first pixel P1 and a second pixel P2 are adjacent to each other in a direction, that is, the y-axis direction in FIG. 4. The light-emitting diode structure 100 may correspond to the first pixel P1 and the second pixel P2.

In other words, one light-emitting diode structure 100 may be arranged in correspondence to the two adjacent pixels P1 and P2.

Furthermore, the light-emitting diode structure 100 may include the first light-emitting diode unit LU1 and the second light-emitting diode unit LU2, where the first light-emitting diode unit LU1 and the second light-emitting diode unit LU2 may correspond to the first pixel P1 and the second pixel P2, respectively.

Furthermore, each of the first pixel P1 and the second pixel P2 includes at least one thin-film transistor ("TFT"). In detail, the first pixel P1 includes a first thin-film transistor TFT1, whereas the second pixel P2 includes a second thin-film transistor TFT2.

The first thin-film transistor TFT1 of the first pixel P1 may be electrically connected to the first light-emitting diode unit LU1, whereas the second thin-film transistor TFT2 of the second pixel P2 may be electrically connected to the second light-emitting diode unit LU2.

The first thin-film transistor TFT1 may be electrically connected to the first light-emitting diode unit LU1 and apply an electric signal to the first light-emitting diode unit LU1. In an exemplary embodiment, the first thin-film transistor TFT1 may drive the first light-emitting diode unit LU1, for example.

The second thin-film transistor TFT2 may be electrically connected to the second light-emitting diode unit LU2 and apply an electric signal to the second light-emitting diode unit LU2. In an exemplary embodiment, the second thin-film transistor TFT2 may drive the second light-emitting diode unit LU2, for example.

Each of the first thin-film transistor TFT1 and the second thin-film transistor TFT2 may include an active layer 1003, a gate electrode 1005, a source electrode 1007, and a drain electrode 1008.

For convenience of explanation, the exemplary embodiment shows a top gate-type pixel in which the gate electrode 1005 is disposed on the active layer 1003. However, it is merely for convenience of explanation, and the first pixel P1 and the second pixel P2 according to the exemplary embodiment may also be bottom gate-type pixels.

Referring to FIGS. 5 and 6, detailed descriptions of the respective components will be given below. Since components of the first thin-film transistor TFT1, e.g., the active layer 1003, the gate electrode 1005, the source electrode 1007, and the drain electrode 1008, are identical to those of the second thin-film transistor TFT2, only the components of one of the first thin-film transistor TFT1 and the second thin-film transistor TFT2 is described below for convenience of explanation.

The substrate 1001 may include various materials. In an exemplary embodiment, the substrate 1001 may include a glass, a metal, or one of various other organic materials.

According to an exemplary embodiment, the substrate 1001 may include a flexible material. In an exemplary embodiment, the substrate 1001 may be bendable, foldable, or rollable, for example.

According to an exemplary embodiment, the substrate 1001 may include a super-thin glass, a metal, or a plastic. In an exemplary embodiment, in the case the substrate 1001 includes a plastic, the substrate 1001 may include polyimide ("PI"), for example. However, it is merely an example, and the substrate 1001 may include various materials.

According to an exemplary embodiment, a bottom protection layer PFL may be arranged on a surface of the substrate 1001 opposite to the surface facing the substrate 1001. The bottom protection layer PFL may reinforce the durability of the substrate 1001 and reduce or prevent introduction of moisture, outside atmosphere, or foreign substances via the substrate 1001.

According to an exemplary embodiment, a buffer layer 1002 may be provided between the substrate 1001 and the active layer 1003. The buffer layer 1002 may reduce or prevent introduction of moisture, outside atmosphere, or foreign substances through the substrate 1001 and may provide a flat surface on the substrate 1001.

In an exemplary embodiment, the buffer layer 1002 may include one of various insulation materials and may include an inorganic material, such as an oxide or a nitride, for example. In an exemplary embodiment, the buffer layer 1002 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$), for example.

The active layer 1003 is disposed on the buffer layer 1002. The active layer 1003 includes a semiconductor material and may include amorphous silicon or polycrystalline silicon, for example. However, the invention is not limited thereto, and the active layer 1003 may include various other materials. According to an exemplary embodiment, the active layer 1003 may include an organic semiconductor material.

According to another exemplary embodiment, the active layer 1003 may include an oxide semiconductor material.

A gate insulation layer 1004 is disposed on the active layer 1003. The gate insulation layer 1004 may include various insulation materials. According to an exemplary embodiment, the gate insulation layer 1004 may include an inorganic material. In an exemplary embodiment, the gate insulation layer 1004 may include an oxide or a nitride, for example. In an exemplary embodiment, the gate insulation layer 1004 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$), for example.

According to an exemplary embodiment, the gate insulation layer 1004 may have a stacked structure including a plurality of layers. The plurality of layers may include a same material or may include different materials from one another. The gate insulation layer 1004 insulates the active layer 1003 and the gate electrode 1005 from each other.

The gate electrode 1005 is arranged on top of the gate insulation layer 1004. The gate electrode 1005 may include a low-resistance metal. In an exemplary embodiment, the gate electrode 1005 may include conductive materials including molybdenum (Mo), aluminum (Al), copper (Cu) and titanium (Ti) and may include a single layer or layers including the above-stated materials, for example.

An interlayer insulation layer 1006 is disposed on the gate electrode 1005. The interlayer dielectric layer 1006 insulates the source electrode 1007 and the gate electrode 1005 from each other and insulates the drain electrode 1008 and the gate electrode 1005 from each other.

The interlayer dielectric layer 1006 may include various insulation materials. According to an exemplary embodiment, the interlayer dielectric layer 1006 may include an inorganic material. In an exemplary embodiment, the interlayer dielectric layer 1006 may include an oxide or a nitride, for example. In an exemplary embodiment, the interlayer dielectric layer 1006 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$), for example.

The source electrode 1007 and the drain electrode 1008 are disposed on the interlayer dielectric layer 1006. Each of the source electrode 1007 and the drain electrode 1008 may include a highly conductive material and include a single layer or layers.

The source electrode 1007 and the drain electrode 1008 are disposed to contact a portion of the active layer 1003.

A passivation layer 1009 is disposed on the source electrode 1007 and the drain electrode 1008.

The passivation layer 1009 may remove steps provided due to the first and second thin-film transistors TFT1 and TFT2 and provide a flat surface above the first and second thin-film transistors TFT1 and TFT2. Furthermore, the passivation layer 1009 may protect the source electrode 1007 and the drain electrode 1008.

The passivation layer 1009 may include various materials. According to an exemplary embodiment, the passivation layer 1009 may include an organic material and may include a single layer or layers.

According to an exemplary embodiment, the passivation layer 1009 may include a common general-purpose polymer, such as polymethylmethacrylate ("PMMA") or polystylene ("PS"), a polymer derivative including a phenol group, an acryl-based polymer, an imide-based polymer, an arylether-based polymer, an amide-based polymer, a fluorine-based polymer, a p-xylene-based polymer, a vinyl alcohol-based polymer, and a blend thereof.

Furthermore, the passivation layer 1009 may include a composite stacked structure including an inorganic insulation layer and an organic insulation layer.

A first pixel electrode PE1 is disposed on the passivation layer 1009 and is electrically connected to either the source electrode 1007 or the drain electrode 1008. In an exemplary embodiment, the first pixel electrode PE1 may be electrically connected to the drain electrode 1008, for example.

The first pixel electrode PE1 may have one of various shapes. In an exemplary embodiment, the first pixel electrode PE1 may be patterned into an island-like shape, for example.

A second pixel electrode PE2 is disposed on the passivation layer 1009 and is electrically connected to either the source electrode 1007 or the drain electrode 1008. In an exemplary embodiment, the second pixel electrode PE2 may be electrically connected to the drain electrode 1008, for example.

The second pixel electrode PE2 may have one of various shapes. In an exemplary embodiment, the second pixel electrode PE2 may be patterned into an island-like shape, for example.

The light-emitting diode structure 100 is disposed on the passivation layer 1009.

The first light-emitting diode unit LU1 of the light-emitting diode structure 100 is electrically connected to the first thin-film transistor TFT1. In detail, the first electrode BE1 of the first light-emitting diode unit LU1 may be electrically connected to the first pixel electrode PE1, and thus the first thin-film transistor TFT1 may be electrically connected to the first light-emitting diode unit LU1.

The second light-emitting diode unit LU2 of the light-emitting diode structure 100 is electrically connected to the second thin-film transistor TFT2. In detail, the first electrode BE2 of the second light-emitting diode unit LU2 may be electrically connected to the second pixel electrode PE2, and thus the second thin-film transistor TFT2 may be electrically connected to the second light-emitting diode unit LU2.

A first counter electrode FE1 and a second counter electrode FE2 are arranged to respectively face the first pixel electrode PE1 and the second pixel electrode PE2 and are respectively electrically connected to the first light-emitting diode unit LU1 and the second light-emitting diode unit LU2 of the light-emitting diode structure 100.

In detail, the first counter electrode FE1 is electrically connected to the second electrode TE1 (refer to FIG. 2E) of first light-emitting diode unit LU1. The second counter electrode FE2 is electrically connected to the second electrode TE2 (refer to FIG. 2E) of the second light-emitting diode unit LU2.

As electric signals are applied to the respective first electrodes BE1 and BE2 of the first light-emitting diode unit LU1 and the second light-emitting diode unit LU2 and electric signals are applied to the respective second electrodes TE1 and TE2 of the first light-emitting diode unit LU1 and the second light-emitting diode unit LU2, each of the first light-emitting diode unit LU1 and the second light-emitting diode unit LU2 may emit one or more lights.

The separation unit SU of the light-emitting diode structure 100 is arranged between the first light-emitting diode unit LU1 and the second light-emitting diode unit LU2 and may reduce or prevent light emitted by the first light-emitting diode unit LU1 and the second light-emitting diode unit LU2 from affecting each other.

In other words, the separation unit SU may reduce the effects of light emitted by the first light-emitting diode unit LU1 corresponding to the first pixel P1 to the second pixel P2 and reduce the effects of light emitted by the second light-emitting diode unit LU2 corresponding to the second pixel P2 to the first pixel P1.

According to an exemplary embodiment, a pixel-defining layer 1010 may be disposed on the passivation layer 1009. An opening corresponding to the first pixel P1 and the second pixel P2 may be defined in the pixel-defining layer 1010.

The light-emitting diode structure 100 is arranged in correspondence to the opening of the pixel-defining layer 1010 and, according to an exemplary embodiment, may be separated from the pixel-defining layer 1010.

Furthermore, according to an exemplary embodiment, the light-emitting diode structure 100 may be arranged at the center of the opening of the pixel-defining layer 1010. Therefore, the light-emitting diode structure 100 may be arranged between the first pixel P1 and the second pixel P2 and, when an occasion demands, the light-emitting diode structure 100 may overlap portions of the first pixel P1 and the second pixel P2.

According to an exemplary embodiment, an opening common to the first pixel P1 and the second pixel P2 adjacent to each other may be defined in the pixel-defining layer 1010.

According to an exemplary embodiment, an opening corresponding to the first pixel P1 and an opening corresponding to the second pixel P2 that is apart from the opening corresponding to the first pixel P1 may be defined in the pixel-defining layer 1010, and an opening corresponding to the light-emitting diode structure 100 and connected to the opening corresponding to the first pixel P1 and the opening corresponding to the second pixel P2 between the two openings may be further defined in the pixel-defining layer 1010.

According to an exemplary embodiment, although not shown, the pixel-defining layer 1010 may cover edge portions of the first pixel electrode PE1 and the second pixel electrode PE2.

According to an exemplary embodiment, the pixel-defining layer 1010 may have a sloped surface. In other words, side surfaces of the openings of the pixel-defining layer 1010 may be sloped surfaces.

According to an exemplary embodiment, a reflective layer 1020 may be disposed on the top surface of the pixel-defining layer 1010. In an exemplary embodiment, the reflective layer 1020 may include a sloped reflective layer 1021, which is disposed on a sloped surface of the pixel-defining layer 1010, and a top reflective layer 1022, which is connected to the sloped reflective layer 1021 and disposed on a substantially flat portion of the top surface of the pixel-defining layer 1010, for example.

The sloped reflective layer 1021 is sloped by a certain angle at which light is efficiently emitted toward a user. In an exemplary embodiment, the sloped reflective layer 1021 may be sloped in a direction for focusing light generated by a light-emitting diode structure upward, for example.

Although not shown, the reflective layer 1020 may be selectively provided even when the pixel-defining layer 1010 is not arranged.

Light generated by the first light-emitting diode unit LU1 and the second light-emitting diode unit LU2 may be reflected by the reflective layer 1020 and forwarded upward, that is, toward a user. As a result, the light efficiency of the display apparatus 1000 may be improved, and thus image quality characteristics thereof may be improved.

According to an exemplary embodiment, a cover layer CL may be disposed on the light-emitting diode structure 100, the first counter electrode FE1, and the second counter electrode FE2, and an intermediate layer 1030 may be provided between the cover layer CL and the first counter electrode FE1 and the second counter electrode FE2.

The intermediate layer 1030 may be disposed on the pixel-defining layer 1010 and the reflective layer 1020 and may protect the light-emitting diode structure 100 and the reflective layer 1020. In an exemplary embodiment, the intermediate layer 1030 may include an inorganic material and may include a highly phototransmissive material, for example.

The first counter electrode FE1 and the second counter electrode FE2 are disposed on the intermediate layer 1030. The first counter electrode FE1 is electrically connected to the second electrode TE1 of the first light-emitting diode unit LU1. The second counter electrode FE2 is electrically connected to the second electrode TE2 of the second light-emitting diode unit LU2.

The cover layer CL includes an inorganic material and is disposed on the first counter electrode FE1 and the second counter electrode FE2 by using a highly phototransmissive material.

According to an exemplary embodiment, a low light transmission member OBU may be provided at least on the light-emitting diode structure 100 to overlap the light-emitting diode structure 100.

According to an exemplary embodiment, as shown in FIG. 6, the low light transmission member OBU may have a width OBUW greater than that of the light-emitting diode structure 100 and an area larger than that of the light-emitting diode structure 100, and thus the low light transmission member OBU may completely cover the light-emitting diode structure 100.

Furthermore, as shown in FIG. 6, according to the exemplary embodiment, the first counter electrode FE1 and the second counter electrode FE2 may be apart from each other, and the first counter electrode FE1 and the second counter electrode FE2 may be connected to a counter electrode line FEL and receive electric signals therefrom. In FIG. 6, a counter electrode FE1' is a first counter electrode connected to another pixel (not shown) adjacent to the first pixel P1.

According to an exemplary embodiment, although not shown, an encapsulation member (not shown) may be further arranged on the low light transmission member OBU, where the encapsulation member may include a glass, a metal, or a plastic.

Furthermore, the encapsulation member may have a structure in which one or more organic layers or inorganic layers are stacked.

The display apparatus 1000 according to the exemplary embodiment includes at least a plurality of pixels P1 and P2 and the light-emitting diode structure 100.

The light-emitting diode structure 100 is arranged between the plurality of pixels P1 and P2, where the first light-emitting diode unit LU1 corresponds to the first pixel P1 and the second light-emitting diode unit LU2 corresponds to the second pixel P2.

Light are generated by the two pixels P1 and P2 via the single light-emitting diode structure 100, and thus the efficiency of driving the display apparatus 1000 is increasing.

Here, the separation unit SU of the light-emitting diode structure 100 may reduce or prevent electric interference of the first light-emitting diode unit LU1 and the second light-emitting diode unit LU2 to each other. Furthermore, according to an exemplary embodiment, when the separation unit SU includes a light transmittance reducing material, e.g., a BM material, effects based on light interferences of the first light-emitting diode unit LU1 and the second light-emitting diode unit LU2 to each other may be reduced or prevented, thereby improving the light characteristics of the display apparatus 1000 and image quality characteristics thereof.

According to an exemplary embodiment, the reflective layer 1020 may be arranged. As a result, light generated by the first light-emitting diode unit LU1 and the second light-emitting diode unit LU2 may be reflected by the reflective layer 1020, and thus light efficiency of the display apparatus 1000 may be improved.

Particularly, according to the exemplary embodiment, the first light-emitting diode unit LU1 and the second light-emitting diode unit LU2 are adjacent to each other in a first direction (the x-axis direction in FIG. 5), and the first pixel P1 and the second pixel P2 are adjacent to each other in the first direction (the x-axis direction in FIG. 5). As a result, light may be generated in a direction parallel to a direction in which pixels are arranged, and the amount of light extracted toward a user may be increased toward a user. As a result, light efficiency may be improved.

Furthermore, according to an exemplary embodiment, the reflective layer 1020 may include the sloped reflective layer 1021 to reflect more light toward a user, thereby improving image quality characteristics of the display apparatus 1000.

Since other operations and effects of the light-emitting diode structure 100 are identical to those described above in the above described exemplary embodiment, detailed descriptions thereof will be omitted.

Figure 7:
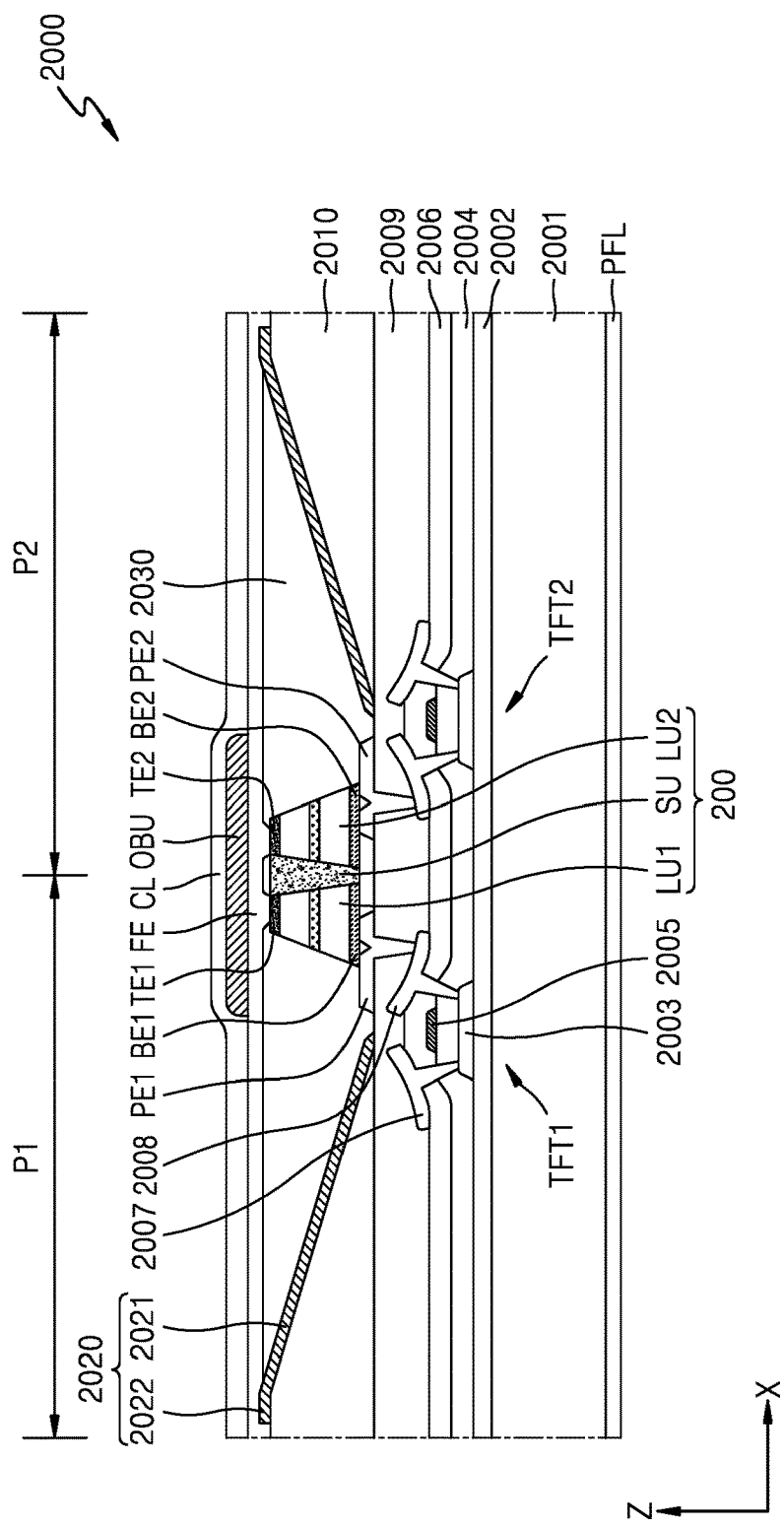
FIG. 7 is a schematic sectional view of another exemplary embodiment of a display apparatus according to the invention.

FIG. 7 is a schematic sectional view of a display apparatus according to another exemplary embodiment.

The display apparatus 2000 includes a plurality of pixels P1 and P2 arranged on a substrate 2001. Furthermore, the display apparatus 2000 may include the plurality of pixels P1 and P2 and one or more light-emitting diode structures 100.

Furthermore, each of the pixels P1 and P2 may include at least one thin-film transistor. In detail, the first pixel P1 may include a first thin-film transistor TFT1, whereas the second pixel P2 may include a second thin-film transistor TFT2.

Each of the first thin-film transistor TFT1 and the second thin-film transistor TFT2 may include an active layer 2003, a gate electrode 2005, a source electrode 2007, and a drain electrode 2008.

Furthermore, according to an exemplary embodiment, a bottom protection layer PFL or a buffer layer 2002 may be arranged.

Furthermore, an interlayer dielectric 2006, a passivation layer 2009, a first pixel electrode PE1, a second pixel electrode PE2, a pixel-defining layer 2010, and a reflective layer 2020 may be arranged.

The above-stated components of the display apparatus 2000 are identical to those of the display apparatus 1000 in the above described exemplary embodiment, and thus detailed descriptions thereof will be omitted.

The display apparatus 2000 according to the exemplary embodiment may include a counter electrode FE. The counter electrode FE may be common to the first pixel P1 and the second pixel P2.

Furthermore, according to an exemplary embodiment, although not shown, the counter electrode FE may be common to all pixels.

According to an exemplary embodiment, a low light transmission member OBU may be disposed on the counter electrode FE.

Furthermore, in another example, a cover layer CL may be disposed on the low light transmission member OBU.

Locations of the low light transmission member OBU and the cover layer CL may be changed compared to those of the display apparatus 1000 according to the above described exemplary embodiment. An intermediate layer 2030 may be disposed on the pixel-defining layer 2010 and the reflective layer 2020, and may protect the light-emitting diode structure 200 and the reflective layer 2020.

Furthermore, locations of the low light transmission member OBU and the cover layer CL according to the exemplary embodiment of FIG. 7 may be applied to the display apparatus 1000 of the above described exemplary embodiment.

FIGS. 8A to 8D are plan views showing various examples of pixel arrangements in a display apparatus according to an exemplary embodiment.

According to an exemplary embodiment, FIGS. 8A to 8D may show pixel arrangements of either the display apparatus 1000 (refer to FIG. 5) or the display apparatus 2000 (refer to FIG. 7).

Figure 8A:
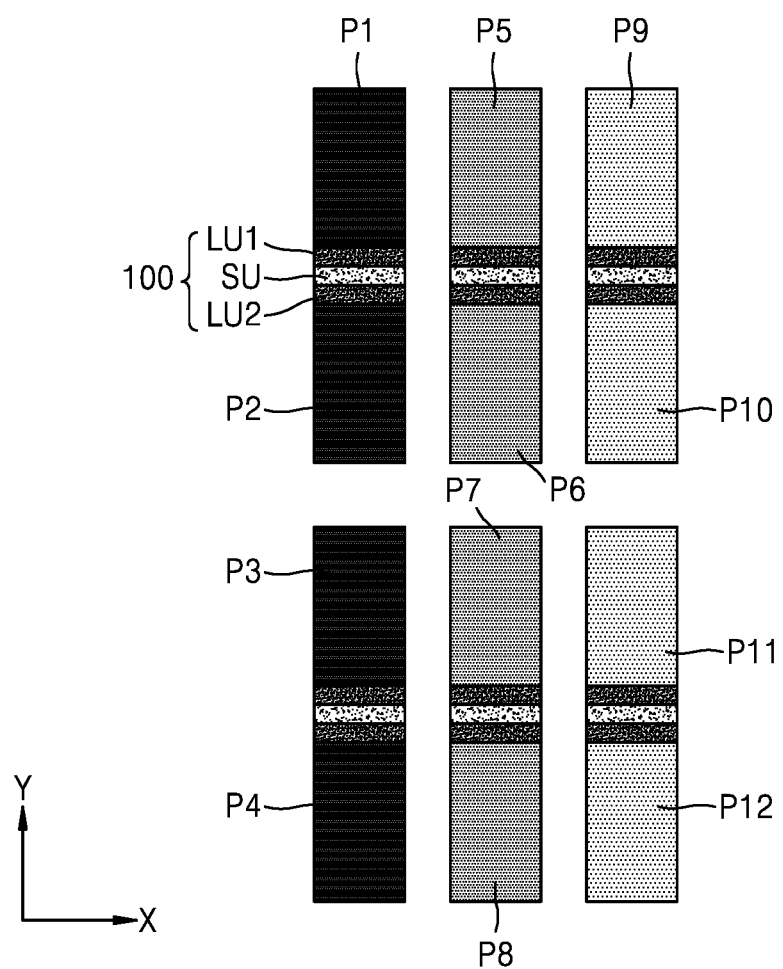
FIGS. 8A to 8D are plan views showing various exemplary embodiments of pixel arrangements in a display apparatus according to the invention.

Referring to FIG. 8A, a first pixel P1 and a second pixel P2 are arranged adjacent to each other, and a light-emitting diode structure 100 is arranged therebetween. Furthermore, third pixel P3 and a fourth pixels P4 are arranged adjacent to each other, and a light-emitting diode structure 100 is arranged therebetween. The first, second, third, and fourth pixels P1, P2, P3, and P4 may be arranged in a first direction (the y-axis direction). Furthermore, according to an exemplary embodiment, the first, second, third, and fourth pixels P1, P2, P3, and P4 may represent light of a same color.

Fifth, sixth, seventh, and eighth pixels P5, P6, P7, and P8 may be arranged in a second direction (the x-axis direction), which crosses the first direction (the y-axis direction), to be adjacent to the first, second, third, and fourth pixels P1, P2, P3, and P4. The fifth, sixth, seventh, and eighth pixels P5, P6, P7, and P8 may be arranged in the first direction (the y-axis direction) in the order stated. Furthermore, according to an exemplary embodiment, the fifth, sixth, seventh, and eighth pixels P5, P6, P7, and P8 may represent light of a same color, which is different from the color of light embodied by the first, second, third, and fourth pixels P1, P2, P3, and P4.

Ninth, tenth, eleventh, and twelfth pixels P9, P10, P11, and P12 may be arranged in a second direction (the x-axis direction), which crosses the first direction (the y-axis direction), to be adjacent to the fifth, sixth, seventh, and eighth pixels P5, P6, P7, and P8. The ninth, tenth, eleventh, and twelfth pixels P9, P10, P11, and P12 may be arranged in the first direction (the y-axis direction) in the order stated.

Furthermore, according to an exemplary embodiment, the ninth, tenth, eleventh, and twelfth pixels P9, P10, P11, and P12 may represent light of a same color, which is different from the color of light embodied by the first, second, third, and fourth pixels P1, P2, P3, and P4 and the color of light embodied by the fifth, sixth, seventh, and eighth pixels P5, P6, P7, and P8.

The respective pixels may be set to emit different colors by controlling a first light-emitting diode unit LU1 and a second light-emitting diode unit LU2 of the light-emitting diode structure 100.

Furthermore, according to an exemplary embodiment, the light-emitting diode structures 100 included in all pixels may be set to emit light of a same color, and the respective pixels may be controlled to emit light of different colors by using a color changing layer (not shown), a color changing filter (not shown), a color filter, etc.

Figure 8B:
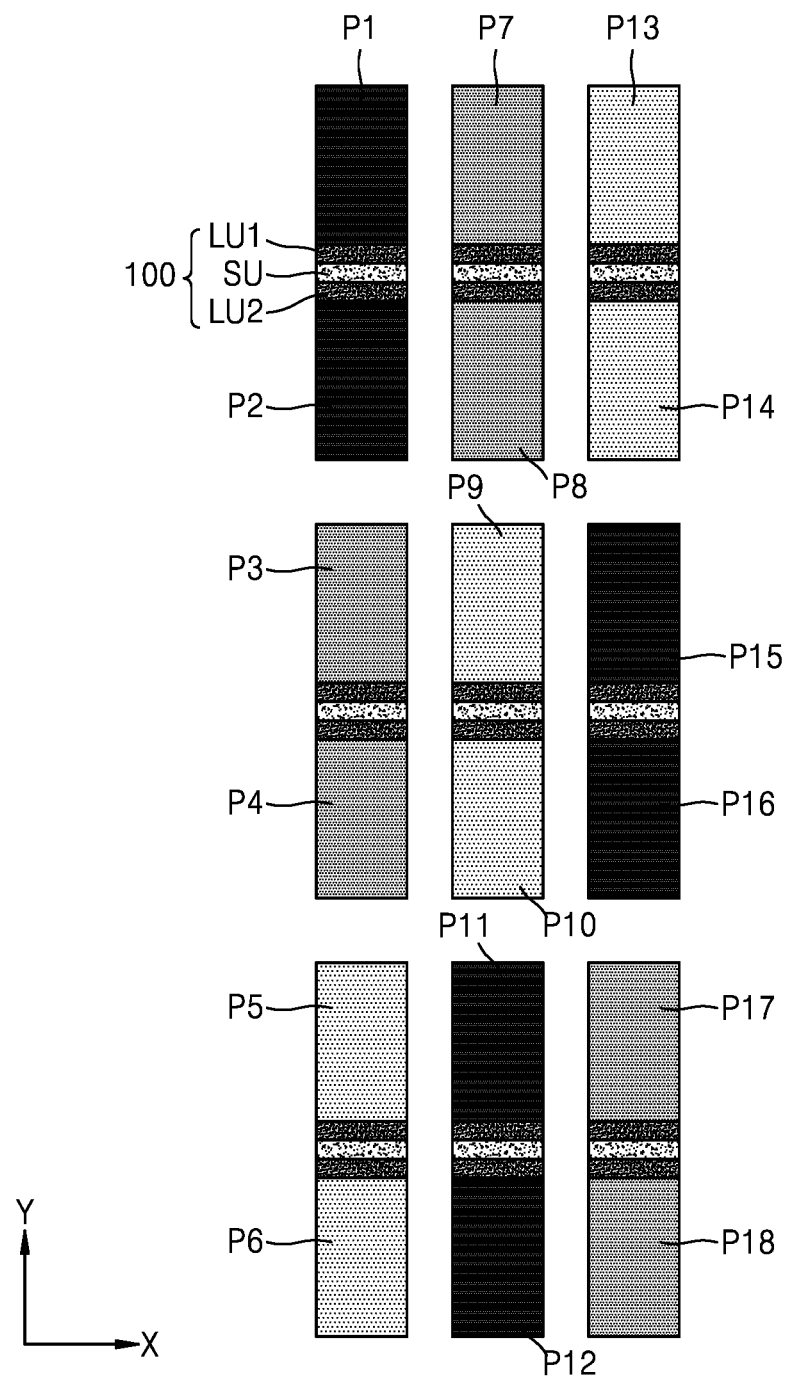

Referring to FIG. 8B, the first pixel P1 and the second pixel P2 are arranged adjacent to each other, and the light-emitting diode structure 100 is arranged therebetween. Furthermore, the third pixel P3 and the fourth pixel P4 are arranged adjacent to each other, and the light-emitting diode structure 100 is arranged therebetween. Furthermore, the fifth pixel P5 and the sixth pixel P6 are arranged adjacent to each other, and the light-emitting diode structure 100 is arranged therebetween.

The first, second, third, fourth, fifth, and sixth pixels P1, P2, P3, P4, P5, and P6 may be arranged in a first direction (the y-axis direction). Furthermore, according to an exemplary embodiment, the pixels P1 and P2 may represent light of a same first color and the third and fourth pixels P3 and P4 may represent light of a same second color, where the first color may be different from the second color. Furthermore, the fifth and sixth pixels P5 and P6 may represent light of a same third color, where the third color may be different from the first color and the second color.

Seventh, eighth, ninth, tenth, eleventh, and twelfth pixels P7, P8, P9, P10, P11, and P12 may be arranged in a second direction (the x-axis direction), which crosses the first direction (the y-axis direction), to be adjacent to the first, second, third, fourth, fifth, and sixth pixels P1, P2, P3, P4, P5, and P6. The seventh, eighth, ninth, tenth, eleventh, and twelfth pixels P7, P8, P9, P10, P11, and P12 may be arranged in the first direction (the y-axis direction) in the order stated.

Furthermore, according to an exemplary embodiment, the seventh and eighth pixels P7 and P8 may represent light of a same second color, the ninth and tenth pixels P9 and P10 may represent light of a second third color, and the eleventh and twelfth pixels P11 and P12 may represent light of a same first color.

Thirteenth, fourteenth, fifteenth, sixteenth, seventeenth, and eighteenth pixels P13, P14, P15, P16, P17, and P18 may be arranged in the second direction (the x-axis direction), which crosses the first direction (the y-axis direction), to be adjacent to the seventh, eighth, ninth, tenth, eleventh, and twelfth pixels P7, P8, P9, P10, P11, and P12. The thirteenth, fourteenth, fifteenth, sixteenth, seventeenth, and eighteenth pixels P13, P14, P15, P16, P17, and P18 may be arranged in the first direction (the y-axis direction) in the order stated.

Furthermore, according to an exemplary embodiment, the thirteenth and fourteenth pixels P13 and P14 may represent light of a same third color, the fifteenth and sixteenth pixels P15 and P16 may represent light of a same first color, and the seventeenth and eighteenth pixels P17 and P18 may represent light of a same second color.

Figure 8C:
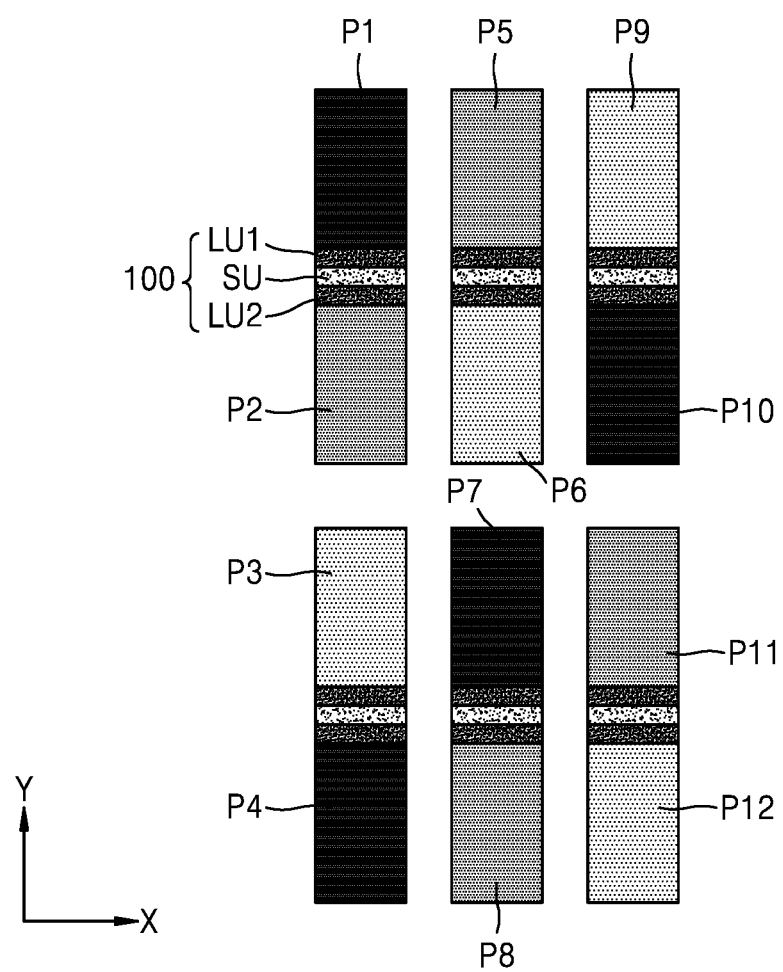

Referring to FIG. 8C, the first pixel P1 and the second pixel P2 are arranged adjacent to each other, and the light-emitting diode structure 100 is arranged therebetween. Furthermore, the third pixel P3 and the fourth pixel P4 are arranged adjacent to each other, and the light-emitting diode structure 100 is arranged therebetween. The first, second, third, and fourth pixels P1, P2, P3, and P4 may be arranged in the first direction (the y-axis direction).

Furthermore, according to an exemplary embodiment, the first pixel P1 may represent light of a first color, whereas the second pixel P2 may represent light of a second color different from the first color. The third pixel P3 may represent light of a third color different from the first color and the second color, whereas the fourth pixel P4 may represent light of the first color.

As described above, pixels adjacent to one another may be set to represent light of different colors by changing materials constituting first light-emitting diode units LU1 and second light-emitting diode units LU2 of the light-emitting diode structures 100. In an exemplary embodiment, colors of light emitted by respective pixels may be controlled by changing materials constituting the photo active layers LL1 and LL2 or materials doped to the photo active layers LL1 and LL2, for example.

The fifth, sixth, seventh, and eighth pixels P5, P6, P7, and P8 may be arranged in the second direction (the x-axis direction), which crosses the first direction (the y-axis direction), to be adjacent to the first, second, third, and fourth pixels P1, P2, P3, and P4. The fifth, sixth, seventh, and eighth pixels P5, P6, P7, and P8 may be arranged in the first direction (the y-axis direction) in the order stated.

Furthermore, according to an exemplary embodiment, the fifth pixel P5 may represent light of a first color, whereas the sixth pixel P6 may represent light of a second color different from the first color. The seventh pixel P7 may represent light of a third color different from the first color and the second color, whereas the eighth pixel P8 may represent light of the first color.

The ninth, tenth, eleventh, and twelfth pixels P9, P10, P11, and P12 may be arranged in the second direction (the x-axis direction), which crosses the first direction (the y-axis direction), to be adjacent to the fifth, sixth, seventh, and eighth pixels P5, P6, P7, and P8. The ninth, tenth, eleventh, and twelfth pixels P9, P10, P11, and P12 may be arranged in the first direction (the y-axis direction) in the order stated.

Furthermore, according to an exemplary embodiment, the ninth pixel P9 may represent light of a third color, whereas the tenth pixel P10 may represent light of a first color. The eleventh pixel P11 may represent light of a second color, whereas the twelfth pixel P12 may represent light of the third color.

Figure 8D:
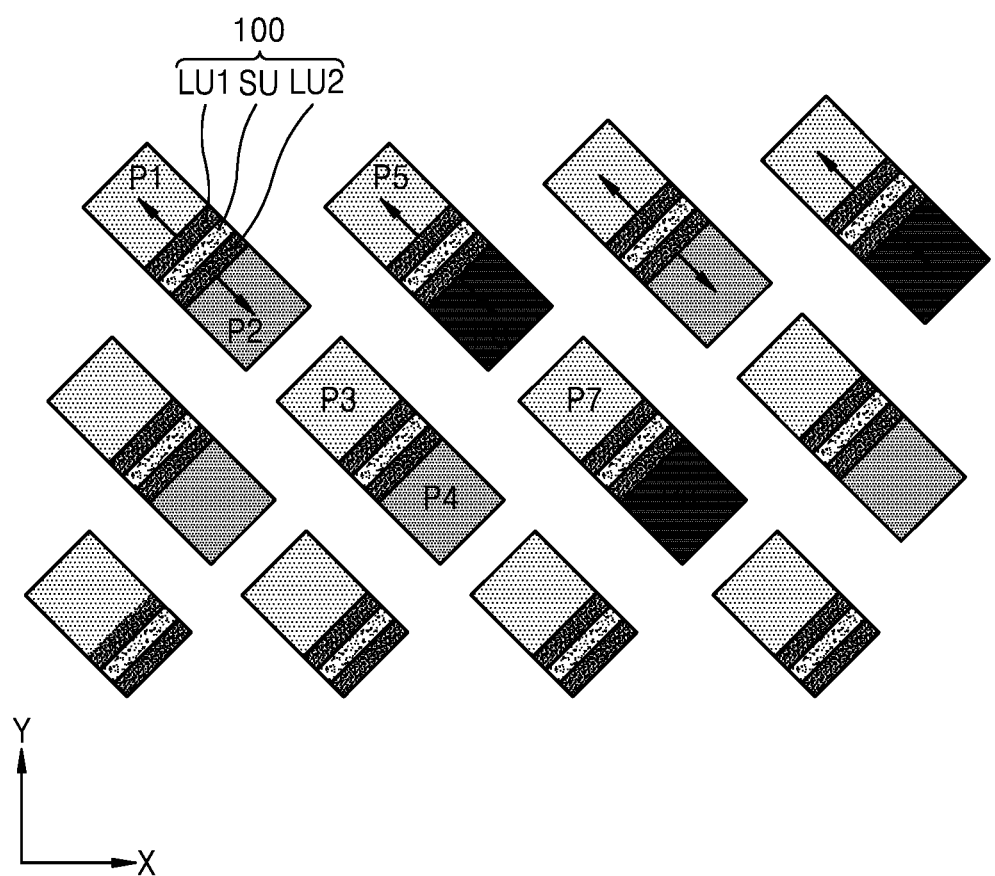

Referring to FIG. 8D, the first pixel P1 and the second pixel P2 are arranged adjacent to each other, and the light-emitting diode structure 100 is arranged therebetween. Furthermore, the third pixel P3 and the fourth pixel P4 are arranged adjacent to each other, and the light-emitting diode structure 100 is arranged therebetween. The first, second, third, and fourth pixels P1, P2, P3, and P4 are arranged in a third direction, which is tilted by an angle smaller than or greater than 90 degrees with respect to the first direction (the y-axis direction) and the second direction (the x-axis direction).

The first direction, the second direction, and the third direction in FIGS. 8A to 8D may be defined variously. In other words, the first direction, the second direction, and the third direction may be defined by edges of a display apparatus. Furthermore, according to an exemplary embodiment, the first direction, the second direction, and the third direction in FIGS. 8A to 8D may be directions based on the eyes of a user while the user is using a display apparatus.

Furthermore, according to an exemplary embodiment, the first pixel P1 may represent light of a first color, whereas the second pixel P2 may represent light of a second color different from the first color. The third pixel P3 may represent light of the first color, whereas the fourth pixel P4 may represent light of the second color.

The fifth, sixth, seventh, and eighth pixels P5, P6, P7, and P8 may be arranged in a direction, which crosses the third direction, to be adjacent to the first, second, third, and fourth pixels P1, P2, P3, and P4. The fifth, sixth, seventh, and eighth pixels P5, P6, P7, and P8 may be arranged in the third direction in the order stated.

Furthermore, according to an exemplary embodiment, the fifth pixel P5 may represent light of a first color, whereas the sixth pixel P6 may represent light of a third color. The seventh pixel P7 may represent light of the first color, and the eighth pixel P8 may represent light of the third color.

Various changes may be made to the arrangement shown in FIG. 8D. In an exemplary embodiment, the pixel arrangement orders shown in FIGS. 8A to 8C may be changed to arrange pixels in the third direction, as shown in FIG. 8D, without changing the order of arranging the pixels, for example.

Figure 9:
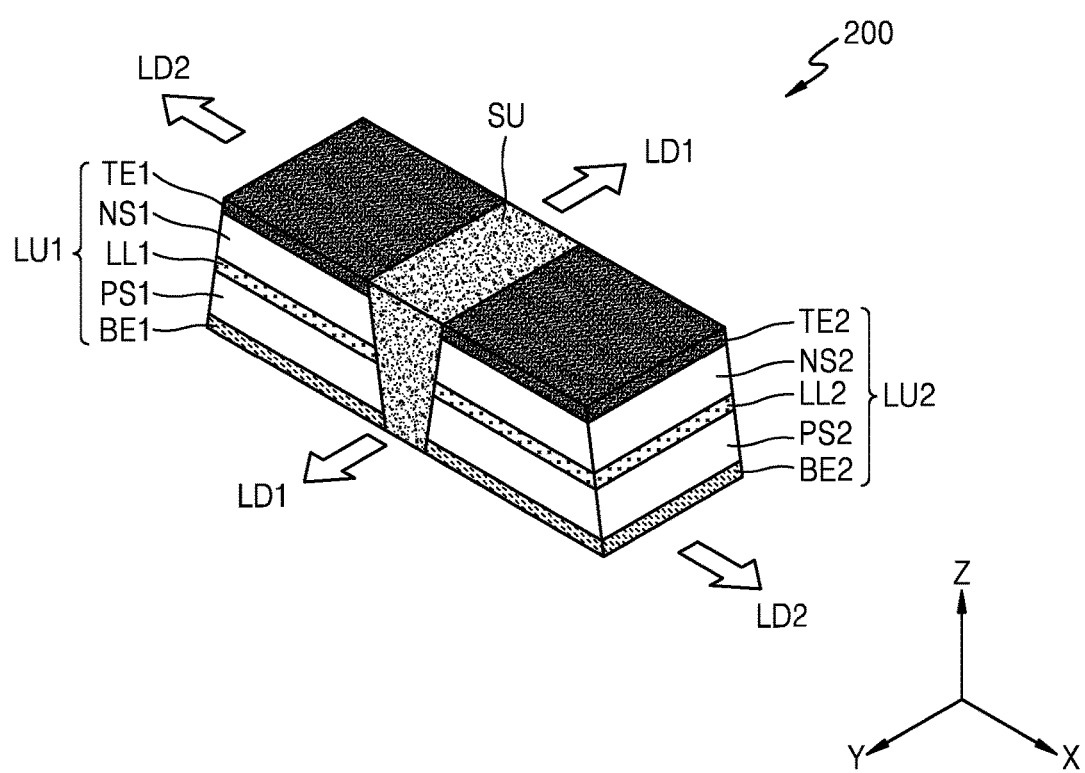
FIG. 9 is a perspective view of another exemplary embodiment of a light-emitting diode structure according to the invention.

FIG. 9 is a perspective view of a light-emitting diode structure according to another exemplary embodiment.

Referring to FIG. 9, a light-emitting diode structure 200 according to an exemplary embodiment includes a plurality of light-emitting diode units LU1 and LU2 and a separation unit SU. In other words, although FIG. 9 shows two light-emitting diode units, the light-emitting diode structure 200 may also include three or more light-emitting diode units.

The plurality of light-emitting diode units LU1 and LU2 includes a first light-emitting diode unit LU1 and a second light-emitting diode unit LU2.

In the light-emitting diode structure 200, the first light-emitting diode unit LU1 and the second light-emitting diode unit LU2 are adjacent to each other in a first direction (the x-axis direction in FIG. 1), and the separation unit SU is arranged therebetween.

In the light-emitting diode structure 200, light may be emitted from surfaces facing the second direction (the y-axis direction in FIG. 9), which crosses the first direction (the x-axis direction in FIG. 9), among surfaces of the first light-emitting diode unit LU1 and the second light-emitting diode unit LU2. Furthermore, although light are emitted from surfaces facing the first direction (the x-axis direction in FIG. 9), the amount of light emitted from the surfaces facing the first direction (the x-axis direction in FIG. 9) may be smaller than the amount of light emitted from the surfaces facing the second direction (the y-axis direction in FIG. 9).

To this end, the first light-emitting diode unit LU1 and the second light-emitting diode unit LU2 have side surfaces between the first electrodes BE1 and BE2 and the second electrodes TE1 and TE2, where side surfaces facing the second direction (the y-axis direction) may be larger than the other side surfaces, e.g., side surfaces facing the first direction (the x-axis direction) that crosses the second direction.

Therefore, the amount of light extracted in a second light extracting direction LD2 may be greater than the amount of light extracted in a first light extracting direction LD1.

Therefore, the light-emitting diode structure 100 may easily emit light in the second direction (the y-axis direction) and a direction opposite thereto.

According to an exemplary embodiment, the side surfaces of the first light-emitting diode unit LU1 and the second light-emitting diode unit LU2 facing the first direction (the x-axis direction) may be provided as sloped surfaces.

In other words, in the light-emitting diode structure 100, surfaces facing the first electrodes BE1 and BE2 may be larger than surfaces facing the second electrodes TE1 and TE2.

In detail, a surface of the first electrode BE1 of the first light-emitting diode unit LU1 may be larger than that of the second electrode TE1. In the same regard, a surface of the first electrode BE2 of the second light-emitting diode unit LU2 may be larger than that of the second electrode TE2.

The first light-emitting diode unit LU1 includes a stacked structure including an n-type semiconductor layer NS1, a p-type semiconductor layer PS1, a photo-active layer LL1, a first electrode BE1, and a second electrode TE1, whereas the second light-emitting diode unit LU2 includes a stacked structure including the n-type semiconductor layer NS2, a p-type semiconductor layer PS2, a photo-active layer LL2, a first electrode BE2, and a second electrode TE2. Since materials constituting the above-stated components are identical to those in the light-emitting diode structure 100 according to the above described exemplary embodiment, detailed descriptions thereof will be omitted.

Furthermore, since the separation unit SU is identical to that of the light-emitting diode structure 100 according to the above described exemplary embodiment, detailed descriptions thereof will be omitted.

Figure 10:
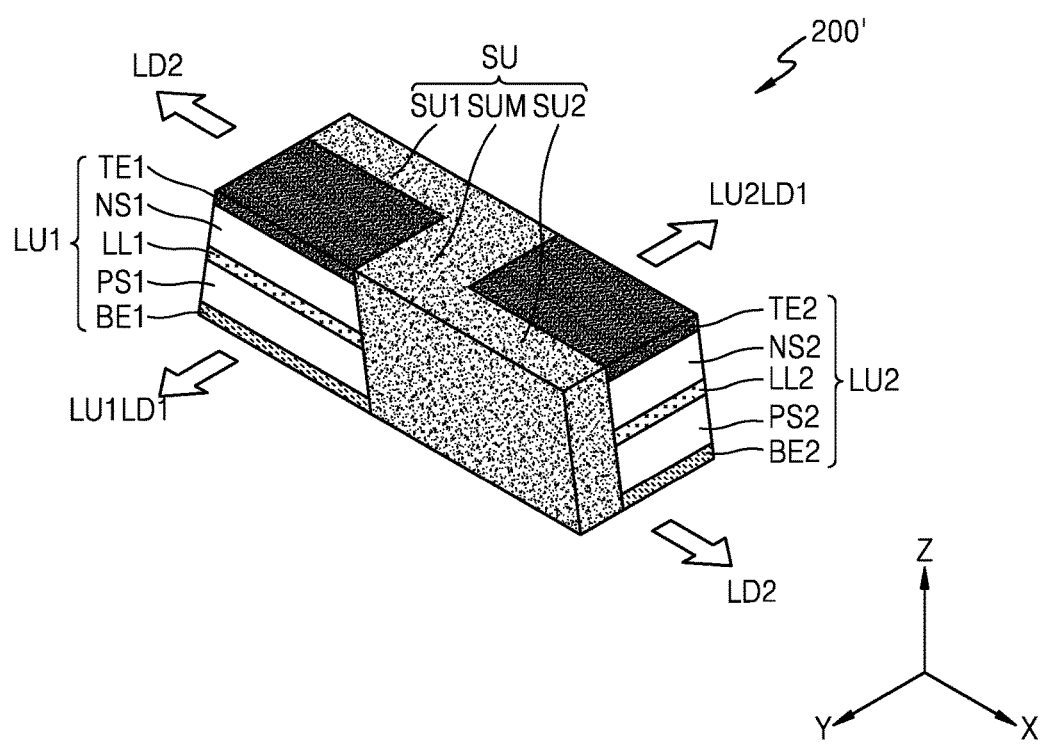
FIG. 10 is an perspective view of a modified example of the light-emitting diode structure of FIG. 9.

FIG. 10 is a perspective view of a modified example of the light-emitting diode structure 200 of FIG. 9.

Referring to FIG. 10, a light-emitting diode structure 200' according to the exemplary embodiment includes a plurality of light-emitting diode units LU1 and LU2 and a separation unit SU.

The separation unit SU includes an intermediate separation unit SUM, a first partitioning wall SU1, and a second partitioning wall SU2.

The intermediate separation unit SUM is arranged between the plurality of light-emitting diode units LU1 and LU2.

The first partitioning wall SU1 is connected to the intermediate separation unit SUM and is arranged in correspondence to a side surface of the first light-emitting diode unit LU1. In other words, the first partitioning wall SU1 is arranged in correspondence to a side surface of the first light-emitting diode unit LU1 facing one of two orientations of a first light extracting direction (the y-axis direction in FIG. 10), where the first light-emitting diode unit LU1 may extract light mainly in a first main light extracting direction LU1LD1 of the first light extracting direction LD1.

The second partitioning wall SU2 is connected to the intermediate separation unit SUM and is arranged in correspondence to a side surface of the second light-emitting diode unit LU2. The second partitioning wall SU2 may be apart from the first partitioning wall SU1.

The second partitioning wall SU2 is arranged in correspondence to a side surface of the second light-emitting diode unit LU2 facing one of two orientations of a first light extracting direction (the y-axis direction in FIG. 10), where the second light-emitting diode unit LU2 may extract light mainly in a first main light extracting direction LU2LD1 of the first light extracting direction LD1.

Figure 11:
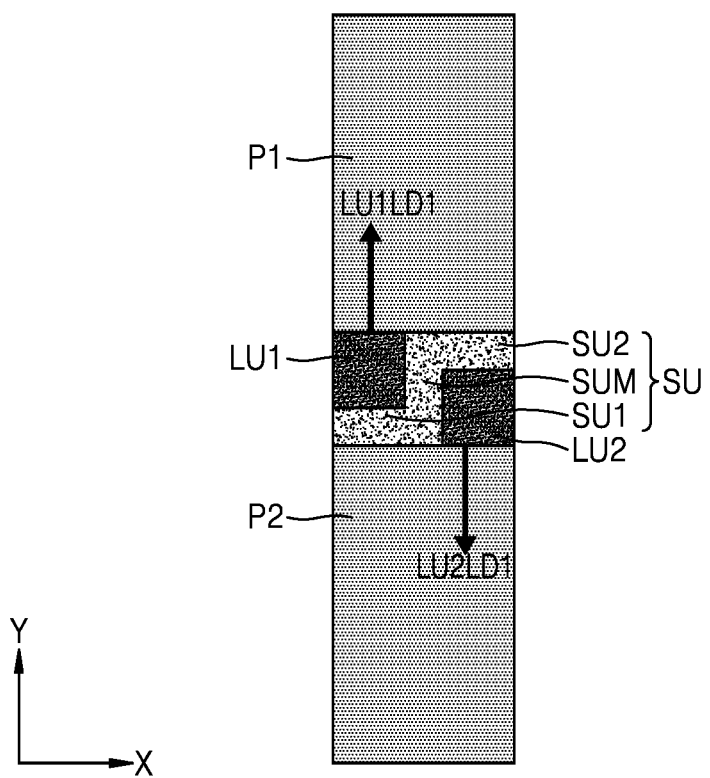
FIG. 11 is a plan view of a pixel structure of a display apparatus including the light-emitting diode structure of FIG. 10.

FIG. 11 is a plan view of a pixel structure of a display apparatus including the light-emitting diode structure 200' of FIG. 10.

Referring to FIG. 11, two adjacent pixels included in the display apparatus, that is, the first pixel P1 and the second pixel P2 are shown.

The light-emitting diode structure 200' of FIG. 10 is arranged between the first pixel P1 and the second pixel P2, light of the first light-emitting diode unit LU1 corresponds to the first pixel P1, and light of the second light-emitting diode unit LU2 corresponds to the second pixel P2.

Here, the first partitioning wall SU1 may reduce the effects of the first light-emitting diode unit LU1 to the second pixel P2, whereas the second partitioning wall SU2 may reduce the effects of the second light-emitting diode unit LU2 to the first pixel P1.

According to an exemplary embodiment, the light-emitting diode structure 200 of FIG. 9 may be arranged between pixels.

Figure 12:
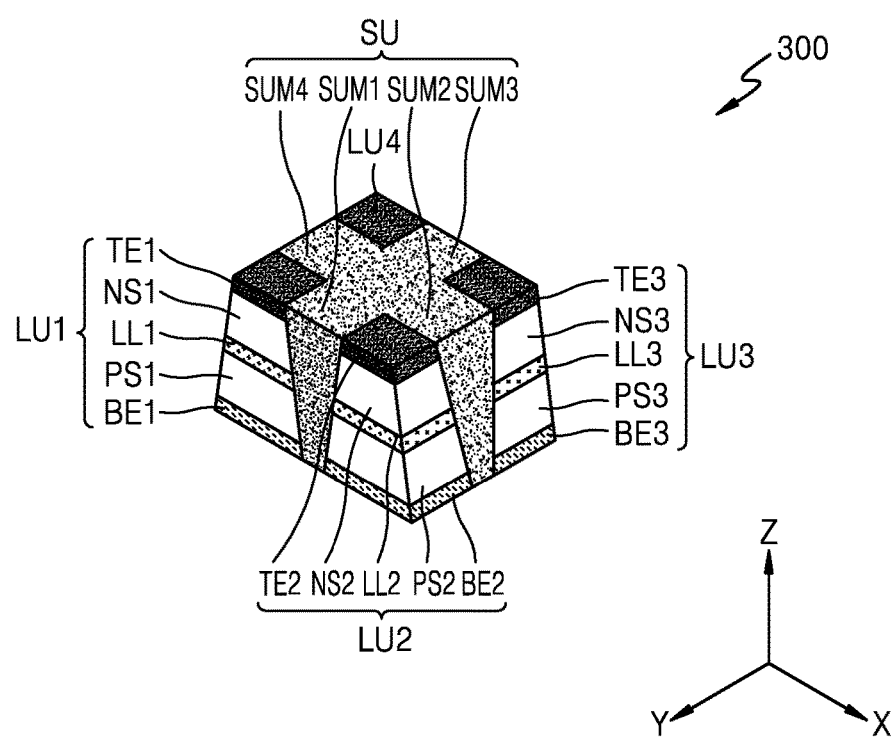
FIG. 12 is a perspective view of another exemplary embodiment of a light-emitting diode structure according to the invention.

FIG. 12 is a perspective view of a light-emitting diode structure according to another exemplary embodiment.

Referring to FIG. 12, a light-emitting diode structure 300 according to an exemplary embodiment includes a plurality of light-emitting diode units LU1, LU2, LU3, and LU4 and a separation unit SU.

The plurality of light-emitting diode units LU1, LU2, LU3, and LU4 includes a first light-emitting diode unit LU1, a second light-emitting diode unit LU2, a third light-emitting diode unit LU3, and a fourth light-emitting diode unit LU4.

The first light-emitting diode unit LU1 and the second light-emitting diode unit LU2 are adjacent to each other in a first direction (the x-axis direction in FIG. 12).

The second light-emitting diode unit LU2 and the third light-emitting diode unit LU3 are adjacent to each other in a second direction (the y-axis direction in FIG. 12), which crosses the first direction (the x-axis direction in FIG. 12).

The third light-emitting diode unit LU3 and the fourth light-emitting diode unit LU4 are adjacent to each other in the first direction (the x-axis direction in FIG. 12).

The first light-emitting diode unit LU1 and the fourth light-emitting diode unit LU4 are adjacent to each other in the second direction (the y-axis direction in FIG. 12).

The separation unit SU is arranged between the four light-emitting diode units LU1, LU2, LU3, and LU4 adjacent to one another. In other words, the separation unit SU may be arranged between the light-emitting diode units LU1, LU2, LU3, and LU4 and separate the light-emitting diode units LU1, LU2, LU3, and LU4 from one another.

According to an exemplary embodiment, the separation unit SU may insulate the light-emitting diode units LU1, LU2, LU3, and LU4. To this end, the separation unit SU may include an insulation material.

Furthermore, according to an exemplary embodiment, the separation unit SU may include a material with low phototransmissivity so as to reduce or block light transmissions between the first light-emitting diode unit LU1, the second light-emitting diode unit LU2, the third light-emitting diode unit LU3, and the fourth light-emitting diode unit LU4. In an exemplary embodiment, the separation unit SU may include a BM, for example.

In detail, the separation unit SU includes a first separation unit SUM1, a second separation unit SUM2, a third separation unit SUM3, and a fourth separation unit SUM4.

The first separation unit SUM1 is arranged between the first light-emitting diode unit LU1 and the second light-emitting diode unit LU2 and separates the first light-emitting diode unit LU1 and the second light-emitting diode unit LU2 from each other.

The second separation unit SUM2 is arranged between the second light-emitting diode unit LU2 and the third light-emitting diode unit LU3 and separates the second light-emitting diode unit LU2 and the third light-emitting diode unit LU3 from each other.

The third separation unit SUM3 is arranged between the third light-emitting diode unit LU3 and the fourth light-emitting diode unit LU4 and separates the third light-emitting diode unit LU3 and the fourth light-emitting diode unit LU4 from each other.

The fourth separation unit SUM4 is arranged between the first light-emitting diode unit LU1 and the fourth light-emitting diode unit LU4 and separates the first light-emitting diode unit LU1 and the fourth light-emitting diode unit LU4 from each other.

According to an exemplary embodiment, the first separation unit SUM1, the second separation unit SUM2, the third separation unit SUM3, and the fourth separation unit SUM4 may be connected to one another.

Particularly, the center region connected to the first separation unit SUM1, the second separation unit SUM2, the third separation unit SUM3, and the fourth separation unit SUM4 may separate the first light-emitting diode unit LU1 and the third light-emitting diode unit LU3 from each other and separate the second light-emitting diode unit LU2 and the fourth light-emitting diode unit LU4 from each other.

Although not shown, a method of fabricating the light-emitting diode structure 300 of FIG. 12 may be similar to the method of fabricating the light-emitting diode structure 100 according to the above described exemplary embodiment. In other words, one light-emitting diode structure 300 may be provided per fabrication process.

According to another exemplary embodiment, the respective light-emitting diode units LU1, LU2, LU3, and LU4 may be combined after being individually provided or an intermediate operation is performed.

Since materials for forming stacked structures included in the first light-emitting diode unit LU1, the second light-emitting diode unit LU2, the third light-emitting diode unit LU3, and the fourth light-emitting diode unit LU4, the stacked structures consisting of n-type semiconductor layers NS1, NS2, and NS3, p-type semiconductor layers PS1, PS2, and PS3, light active layers LL1, LL2, and LL3, first electrodes BE1, BE2, and BE3, and second electrodes TE1, TE2, and TE3 are identical to those in the light-emitting diode structure 100 according to the above described exemplary embodiment, detailed descriptions thereof will be omitted.

Although not shown in FIG. 12, the fourth light-emitting diode unit LU4 also includes the stacked structure consisting of n-type semiconductor layer, p-type semiconductor layer, light active layer, first electrode and second electrode like one of the first light-emitting diode unit LU1, the second light-emitting diode unit LU2 and the third light-emitting diode unit LU3.

In the light-emitting diode structure 300 according to the exemplary embodiment, the first light-emitting diode unit LU1, the second light-emitting diode unit LU2, the third light-emitting diode unit LU3, and the fourth light-emitting diode unit LU4 are adjacent to one another in a first direction (the x-axis direction in FIG. 12) and a second direction (the y-axis direction in FIG. 12), where the separation unit SU is arranged therebetween.

Light may be emitted from surfaces of the first light-emitting diode unit LU1, the second light-emitting diode unit LU2, the third light-emitting diode unit LU3, and the fourth light-emitting diode unit LU4 of the light-emitting diode structure 300 facing the first direction (the x-axis direction in FIG. 12). Furthermore, light may also be emitted from surfaces thereof facing the second direction (the y-axis direction in FIG. 12), which crosses the first direction.

Furthermore, according to an exemplary embodiment, shapes of the first light-emitting diode unit LU1, the second light-emitting diode unit LU2, the third light-emitting diode unit LU3, and the fourth light-emitting diode unit LU4 including side surfaces may be controlled, such that the amount of light emitted by surfaces facing the first direction (the x-axis direction in FIG. 12) is identical or similar to the amount of light emitted by surfaces facing the second direction (the y-axis direction in FIG. 12).

Here, the first light-emitting diode unit LU1, the second light-emitting diode unit LU2, the third light-emitting diode unit LU3, and the fourth light-emitting diode unit LU4 may emit light of a same type.

Furthermore, according to an exemplary embodiment, the first light-emitting diode unit LU1, the second light-emitting diode unit LU2, the third light-emitting diode unit LU3, and the fourth light-emitting diode unit LU4 may emit light of different types. In other words, the first light-emitting diode unit LU1, the second light-emitting diode unit LU2, the third light-emitting diode unit LU3, and the fourth light-emitting diode unit LU4 may emit light of different types by controlling doping to the photo active layers LL1, LL2, LL3, and LL4.

A surface of the light-emitting diode structure 300 facing the first electrodes BE1, BE2, and BE3 may be larger than a surface of the light-emitting diode structure 300 facing the second electrodes TE1, TE2, and TE3.

Therefore, when the light-emitting diode structure 300 is arranged at another member, the light-emitting diode structure 300 may be arranged, such that the first electrodes BE1, BE2, and BE3 face downward. As a result, the light-emitting diode structure 300 may be stably arranged.

A surface of the separation unit SU adjacent to the first electrodes BE1, BE2, and BE3 may be smaller than a surface of the separation unit SU adjacent to the second electrodes TE1, TE2, and TE3. Therefore, the separation unit SU may effectively separate the first light-emitting diode unit LU1, the second light-emitting diode unit LU2, the third light-emitting diode unit LU3, and the fourth light-emitting diode unit LU4 from each other and prevent destruction of or damage to the separation unit SU, thereby reducing or preventing the first light-emitting diode unit LU1, the second light-emitting diode unit LU2, the third light-emitting diode unit LU3, and the fourth light-emitting diode unit LU4 from contacting each other or interference between light from the first light-emitting diode unit LU1, the second light-emitting diode unit LU2, the third light-emitting diode unit LU3, and the fourth light-emitting diode unit LU4.

Figure 13:
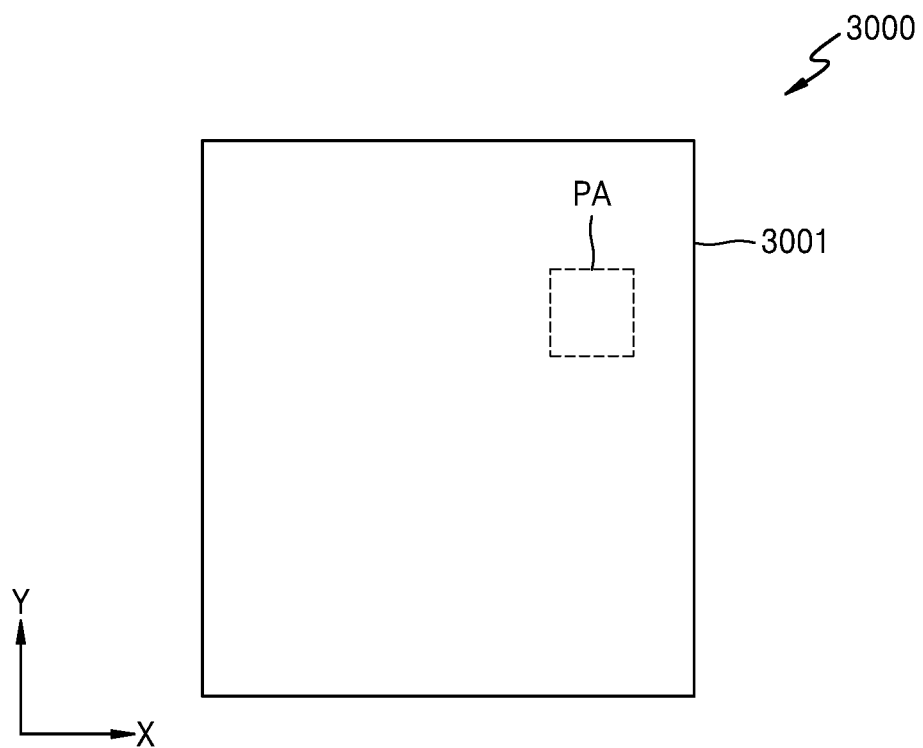
FIG. 13 is a plan view of another exemplary embodiment of a display apparatus according to the invention.
Figure 14:
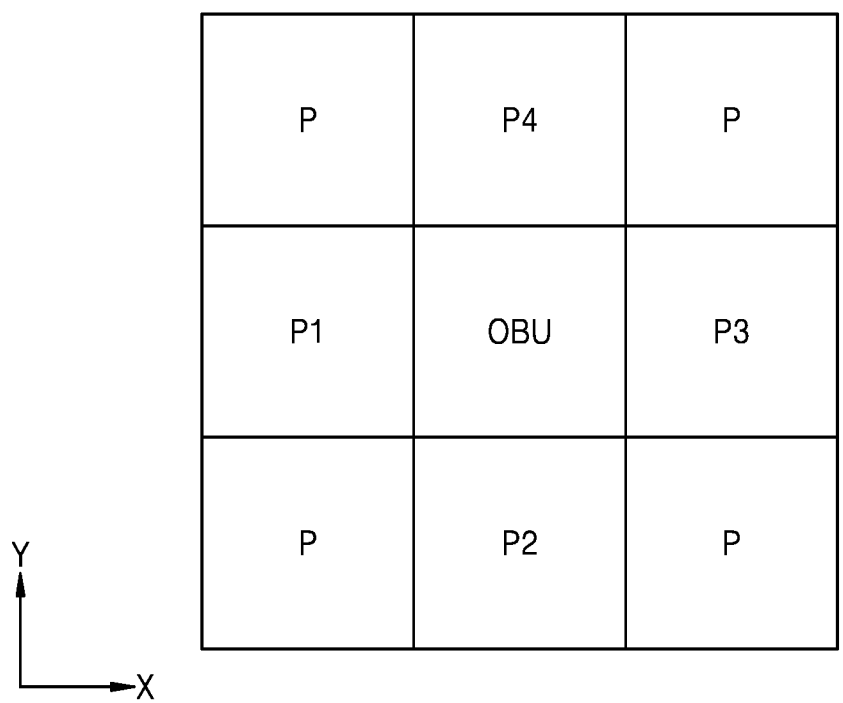
FIG. 14 is a diagram showing PA of FIG. 13 in closer detail.
Figure 15:
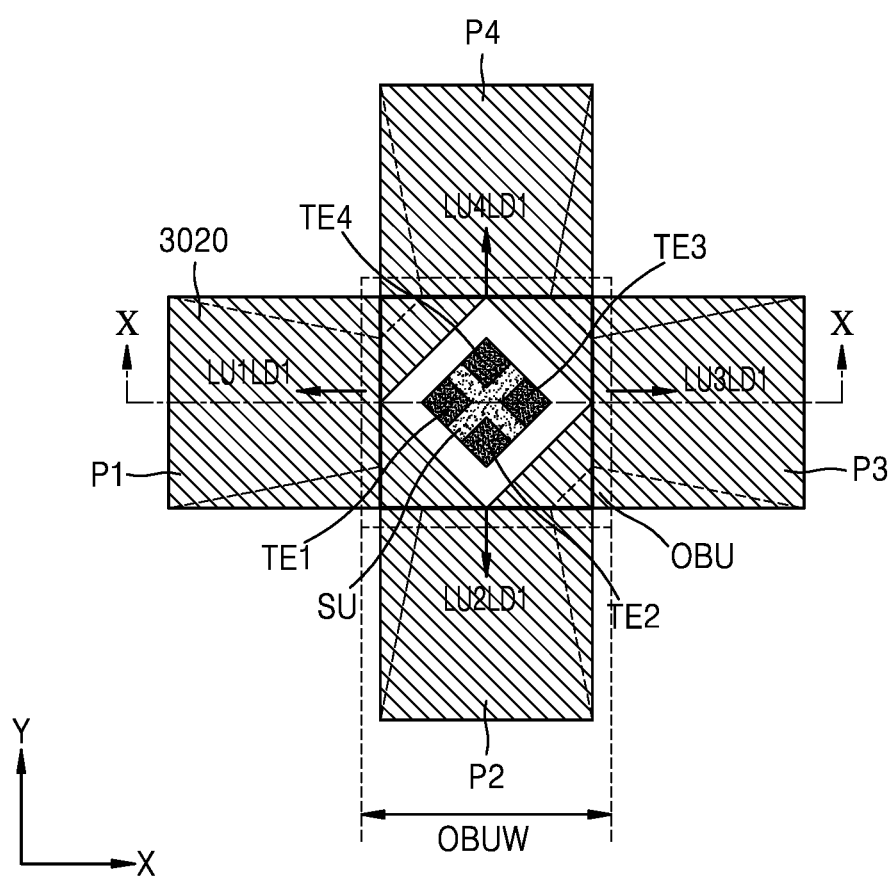
FIG. 15 is a plan view for describing the light-emitting diode structure and the reflective layer of FIG. 14.
Figure 16:
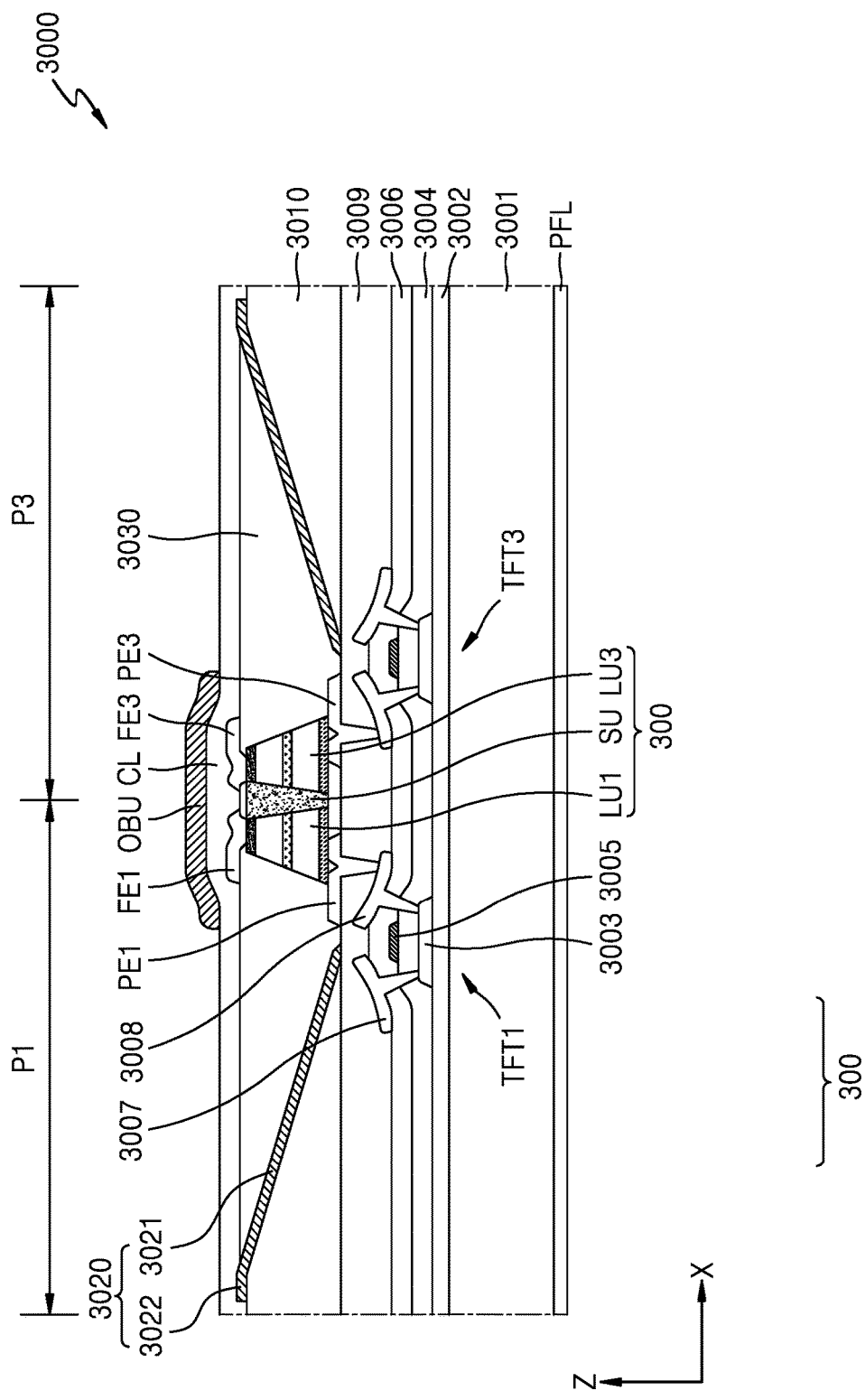
FIG. 16 is a sectional view that is obtained along line X-X of FIG. 15.

FIG. 13 is a plan view of a display apparatus according to another exemplary embodiment, FIG. 14 is a diagram showing PA of FIG. 13 in closer detail, FIG. 15 is a plan view for describing the light-emitting diode structure and the reflective layer of FIG. 14, and FIG. 16 is a sectional view that is obtained along line X-X of FIG. 15.

A display apparatus 3000 according to the exemplary embodiment includes a plurality of pixels P arranged on a substrate 3001. A user may recognize one or more images via the pixels P.

Furthermore, the display apparatus 3000 may include the pixels P and one or more light-emitting diode structures 300 (refer to FIG. 12).

Since the light-emitting diode structure 300 is described above with FIG. 12, as described above, detailed descriptions thereof will be omitted.

FIG. 14 shows nine pixels adjacent to one another, and FIG. 15 shows four pixels P1, P2, P3, and P4 for convenience of explanation.

The first pixel P1 and the third pixel P3 are adjacent to each other in a first direction, that is, the x-axis direction in FIG. 14. The second pixel P2 and the fourth pixel P4 are adjacent to each other in a second direction, that is, the y-axis direction in FIG. 14.

The light-emitting diode structure 300 may correspond to the first, second, third, and fourth pixels P1, P2, P3, and P4.

In other words, the single light-emitting diode structure 300 may be arranged in correspondence to the four pixels P1, P2, P3, and P4 adjacent to one another.

According to an exemplary embodiment, the four pixels P1, P2, P3, and P4 adjacent to one another may form a cross-like shape around the light-emitting diode structure 300.

Furthermore, the light-emitting diode structure 300 may include a first light-emitting diode unit LU1, a second light-emitting diode unit LU2, a third light-emitting diode unit LU3, and a fourth light-emitting diode unit LU4, where the first light-emitting diode unit LU1, the second light-emitting diode unit LU2, the third light-emitting diode unit LU3, and the fourth light-emitting diode unit LU4 may correspond to the first pixel P1, the second pixel P2, the third pixel P3, and the fourth pixel P4, respectively.

Furthermore, as shown in FIG. 15, side surfaces of the first light-emitting diode unit LU1 between a first electrode BE1 and a second electrode TE1 may correspond to the first pixel P1. In detail, two adjacent side surface of the first light-emitting diode unit LU1 between the first electrode BE1 and the second electrode TE1 may correspond to the first pixel P1. In an exemplary embodiment, a corner between adjacent side surfaces of the first light-emitting diode unit LU1 may correspond to the first pixel P1, for example.

Therefore, the first light-emitting diode unit LU1 may generate a large amount of light in a first main light extracting direction LU1LD1 in correspondence to the first pixel P1.

Side surfaces of the second light-emitting diode unit LU2 between a first electrode BE2 and a second electrode TE2 may correspond to the second pixel P2. In detail, two adjacent side surface of the second light-emitting diode unit LU2 between the first electrode BE2 and the second electrode TE2 may correspond to the second pixel P2. In an exemplary embodiment, a corner between adjacent side surfaces of the second light-emitting diode unit LU2 may correspond to the second pixel P2, for example.

Therefore, the second light-emitting diode unit LU2 may generate a large amount of light in a first main light extracting direction LU2LD1 in correspondence to the second pixel P2.

Side surfaces of the third light-emitting diode unit LU3 between a first electrode BE3 and a second electrode TE3 may correspond to the third pixel P3. In detail, two adjacent side surface of the third light-emitting diode unit LU3 between the first electrode BE3 and the second electrode TE3 may correspond to the third pixel P3. In an exemplary embodiment, a corner between adjacent side surfaces of the third light-emitting diode unit LU3 may correspond to the third pixel P3, for example.

Therefore, the third light-emitting diode unit LU3 may generate a large amount of light in a first main light extracting direction LU3LD1 in correspondence to the third pixel P3.

Side surfaces of the fourth light-emitting diode unit LU4 between a first electrode BE4 and a second electrode TE4 may correspond to the fourth pixel P4. In detail, two adjacent side surface of the fourth light-emitting diode unit LU4 between the first electrode BE4 and the second electrode TE4 may correspond to the fourth pixel P4. In an exemplary embodiment, a corner between adjacent side surfaces of the fourth light-emitting diode unit LU4 may correspond to the fourth pixel P4, for example.

Therefore, the fourth light-emitting diode unit LU4 may generate a large amount of light in a first main light extracting direction LU4LD1 in correspondence to the fourth pixel P4.

Furthermore, each of the first pixel P1, the second pixel P2, the third pixel P3, and the fourth pixel P4 includes at least one thin-film transistor.

Detailed descriptions thereof will be given below with reference to FIG. 16. For convenience of explanation, the below descriptions are given in relation to the first pixel P1 and the third pixel P3. Since each of the second pixel P2 and the fourth pixel P4 may include one or more thin-film transistors and may have a substantially same configuration as that of the first pixel P1 and the third pixel P3, detailed descriptions thereof will be omitted.

Referring to FIG. 16, the first pixel P1 includes a first thin-film transistor TFT1, whereas the third pixel P3 includes a third thin-film transistor TFT3.

The first thin-film transistor TFT1 of the first pixel P1 may be electrically connected to the first light-emitting diode unit LU1, whereas the third thin-film transistor TFT3 of the third pixel P3 may be electrically connected to the third light-emitting diode unit LU3.

The first thin-film transistor TFT1 may be electrically connected to the first light-emitting diode unit LU1 and may apply an electric signal to the first light-emitting diode unit LU1. In an exemplary embodiment, the first thin-film transistor TFT1 may drive the first light-emitting diode unit LU1, for example.

The third thin-film transistor TFT3 may be electrically connected to the third light-emitting diode unit LU3 and may apply an electric signal to the third light-emitting diode unit LU3. In an exemplary embodiment, the third thin-film transistor TFT3 may drive the third light-emitting diode unit LU3, for example.

Each of the first thin-film transistor TFT1 and the third thin-film transistor TFT3 may include an active layer 3003, a gate electrode 3005, a source electrode 3007, and a drain electrode 3008.

For convenience of explanation, the exemplary embodiment shows a top gate-type pixel in which the gate electrode 3005 is disposed on the active layer 3003. However, it is merely for convenience of explanation, and the first pixel P1, the second pixel P2, the third pixel P3, and the fourth pixel P4 according to the exemplary embodiment may also be bottom gate-type pixels.

Referring to FIGS. 15 and 16, the respective components will be described below in detail. Since components of the first thin-film transistor TFT1, e.g., the active layer 3003, the gate electrode 3005, the source electrode 3007, and the drain electrode 3008, are identical to those of the third thin-film transistor TFT3, only the components of one of the first thin-film transistor TFT1 and the third thin-film transistor TFT3 is described below for convenience of explanation.

The substrate 3001 may include various materials. In detail, the substrate 3001 may include a glass, a metal, or one of various other organic materials.

According to an exemplary embodiment, the substrate 3001 may include a flexible material. In an exemplary embodiment, the substrate 3001 may be bendable, foldable, or rollable, for example.

According to an exemplary embodiment, the substrate 3001 may include a super-thin glass, a metal, or a plastic. In an exemplary embodiment, in the case the substrate 3001 includes a plastic, the substrate 3001 may include PI, for example. However, it is merely an example, and the substrate 3001 may include various materials.

According to an exemplary embodiment, a bottom protection layer PFL may be arranged on a surface of the substrate 3001 opposite to the surface facing the substrate 3001. The bottom protection layer PFL may reinforce the durability of the substrate 3001 and reduce or prevent introduction of moisture, outside atmosphere, or foreign substances via the substrate 3001.

According to an exemplary embodiment, a buffer layer 3002 may be provided between the substrate 3001 and the active layer 3003. The buffer layer 3002 may reduce or prevent introduction of moisture, outside atmosphere, or foreign substances through the substrate 3001 and may provide a flat surface on the substrate 3001.

The buffer layer 3002 may include one of various insulation materials and may include an inorganic material, such as an oxide or a nitride, for example. In an exemplary embodiment, the buffer layer 3002 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$), for example.

The active layer 3003 is disposed on the buffer layer 3002. The active layer 3003 includes a semiconductor material and may include amorphous silicon or polycrystalline silicon, for example. However, the invention is not limited thereto, and the active layer 3003 may include various other materials. According to an exemplary embodiment, the active layer 3003 may include an organic semiconductor material.

According to another exemplary embodiment, the active layer 3003 may include an oxide semiconductor material.

A gate insulation layer 3004 is disposed on the active layer 3003. The gate insulation layer 3004 may include various insulation materials. According to an exemplary embodiment, the gate insulation layer 3004 may include an inorganic material. In an exemplary embodiment, the gate insulation layer 3004 may include an oxide or a nitride, for example. In an exemplary embodiment, the gate insulation layer 3004 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$), for example.

According to an exemplary embodiment, the gate insulation layer 3004 may have a stacked structure including a plurality of layers. The plurality of layers may include a same material or may include different materials from one another. The gate insulation layer 3004 insulates the active layer 3003 and the gate electrode 3005 from each other.

The gate electrode 3005 is arranged on top of the gate insulation layer 3004. The gate electrode 3005 may include a low-resistance metal. In an exemplary embodiment, the gate electrode 3005 may include conductive materials including molybdenum (Mo), aluminum (Al), copper (Cu) and titanium (Ti) and may include a single layer or layers including the above-stated materials, for example.

An interlayer insulation layer 3006 is disposed on the gate electrode 3005. The interlayer dielectric 3006 insulates the source electrode 3007 and the gate electrode 3005 from each other and insulates the drain electrode 3008 and the gate electrode 3005 from each other.

The interlayer dielectric 3006 may include various insulation materials. According to an exemplary embodiment, the interlayer dielectric 3006 may include an inorganic material. In an exemplary embodiment, the interlayer dielectric 3006 may include an oxide or a nitride, for example. In an exemplary embodiment, the interlayer dielectric 3006 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$), for example.

The source electrode 3007 and the drain electrode 3008 are disposed on the interlayer dielectric 3006. Each of the source electrode 3007 and the drain electrode 3008 may include a highly conductive material and include a single layer or layers.

The source electrode 3007 and the drain electrode 3008 contact a portion of the active layer 3003.

A passivation layer 3009 is disposed on the source electrode 3007 and the drain electrode 3008.

The passivation layer 3009 may remove steps provided due to the first and third thin-film transistors TFT1 and TFT3 and provide a flat surface above the first and third thin-film transistors TFT1 and TFT3. Furthermore, the passivation layer 3009 may protect the source electrode 3007 and the drain electrode 3008.

The passivation layer 3009 may include various materials. According to an exemplary embodiment, the passivation layer 3009 may include an organic material and may include a single layer or layers.

According to an exemplary embodiment, the passivation layer 3009 may include a common general-purpose polymer, such as PMMA or PS, a polymer derivative including a phenol group, an acryl-based polymer, an imide-based polymer, an arylether-based polymer, an amide-based polymer, a fluorine-based polymer, a p-xylene-based polymer, a vinyl alcohol-based polymer, and a blend thereof.

Furthermore, the passivation layer 3009 may include a composite stacked structure including an inorganic insulation layer and an organic insulation layer.

A first pixel electrode PE1 is disposed on the passivation layer 3009 and is electrically connected to either the source electrode 3007 or the drain electrode 3008. In an exemplary embodiment, the first pixel electrode PE1 may be electrically connected to the drain electrode 3008, for example.

The first pixel electrode PE1 may have one of various shapes. In an exemplary embodiment, the first pixel electrode PE1 may be patterned into an island-like shape, for example.

A third pixel electrode PE3 is disposed on the passivation layer 3009 and is electrically connected to either the source electrode 3007 or the drain electrode 3008. In an exemplary embodiment, the third pixel electrode PE3 may be electrically connected to the drain electrode 3008, for example.

The third pixel electrode PE3 may have one of various shapes. In an exemplary embodiment, the second pixel electrode PE2 may be patterned into an island-like shape, for example.

The light-emitting diode structure 300 is disposed on the passivation layer 3009.

The first light-emitting diode unit LU1 of the light-emitting diode structure 300 is electrically connected to the first thin-film transistor TFT1. In detail, the first electrode BE1 of the first light-emitting diode unit LU1 may be electrically connected to the first pixel electrode PE1, and thus the first thin-film transistor TFT1 may be electrically connected to the first light-emitting diode unit LU1.

The third light-emitting diode unit LU3 of the light-emitting diode structure 300 is electrically connected to the third thin-film transistor TFT3. In detail, the first electrode BE3 of the third light-emitting diode unit LU3 may be electrically connected to the third pixel electrode PE3, and thus the third thin-film transistor TFT3 may be electrically connected to the third light-emitting diode unit LU3.

A first counter electrode FE1 and a third counter electrode FE3 are arranged to respectively face the first pixel electrode PE1 and the third pixel electrode PE3 and are respectively electrically connected to the first light-emitting diode unit LU1 and the third light-emitting diode unit LU3 of the light-emitting diode structure 300.

In detail, the first counter electrode FE1 and the third counter electrode FE3 are electrically connected to the second electrode TE1 of the first light-emitting diode unit LU1 and the second electrode TE3 of the third light-emitting diode unit LU3, respectively.

As electric signals are applied to the respective first electrodes BE1 and BE3 of the first light-emitting diode unit LU1 and the third light-emitting diode unit LU3 and electric signals are applied to the respective second electrodes TE1 and TE3 of the first light-emitting diode unit LU1 and the third light-emitting diode unit LU3, each of the first light-emitting diode unit LU1 and the third light-emitting diode unit LU3 may emit one or more lights.

The separation unit SU of the light-emitting diode structure 300 is arranged between the first light-emitting diode unit LU1 and the third light-emitting diode unit LU3 and may reduce or prevent light emitted by the first light-emitting diode unit LU1 and the third light-emitting diode unit LU3 from affecting each other.

In other words, the separation unit SU may reduce the effects of light emitted by the first light-emitting diode unit LU1 corresponding to the first pixel P1 to the second pixel P2 and reduce the effects of light emitted by the third light-emitting diode unit LU3 corresponding to the second pixel P3 to the first pixel P1.

According to an exemplary embodiment, a pixel-defining layer 3010 may be disposed on the passivation layer 3009. An opening corresponding to the first pixel P1, the second pixel P2, the third pixel P3, and the fourth pixel P4 may be defined in the pixel-defining layer 3010.

The light-emitting diode structure 300 is arranged in correspondence to the opening of the pixel-defining layer 3010 and, according to an exemplary embodiment, may be separated from the pixel-defining layer 3010.

Furthermore, according to an exemplary embodiment, the light-emitting diode structure 300 may be arranged at the center of the opening of the pixel-defining layer 3010. Therefore, the light-emitting diode structure 300 may be arranged between the first pixel P1, the second pixel P2, the third pixel P3, and the fourth pixel P4 and, when an occasion demands, the light-emitting diode structure 300 may overlap portions of the first pixel P1, the second pixel P2, the third pixel P3, and the fourth pixel P4.

According to an exemplary embodiment, an opening common to the first pixel P1, the second pixel P2, the third pixel P3, and the fourth pixel P4 adjacent to one another may be defined in the pixel-defining layer 3010.

According to an exemplary embodiment, an opening corresponding to the first pixel P1, an opening corresponding to the second pixel P2, an opening corresponding to the third pixel P3, and an opening corresponding to the fourth pixel P4 may be defined in the pixel-defining layer 3010, and an opening corresponding to the light-emitting diode structure 300 and connected to the opening corresponding to the first pixel P1, the opening corresponding to the second pixel P2, the opening corresponding to the third pixel P3, and the opening corresponding to the fourth pixel P4 between the four openings may be further defined in the pixel-defining layer 3010.

According to an exemplary embodiment, although not shown, the pixel-defining layer 3010 may cover edge portions of the first pixel electrode PE1 and the third pixel electrode PE3.

According to an exemplary embodiment, the pixel-defining layer 3010 may have a sloped surface. In other words, side surfaces of the openings of the pixel-defining layer 3010 may be sloped surfaces.

According to an exemplary embodiment, a reflective layer 3020 may be disposed on the top surface of the pixel-defining layer 3010. In an exemplary embodiment, the reflective layer 3020 may include a sloped reflective layer 3021, which is disposed on a sloped surface of the pixel-defining layer 3010, and a top reflective layer 3022, which is connected to the sloped reflective layer 3021 and disposed on a substantially flat portion of the top surface of the pixel-defining layer 3010, for example.

Although not shown, the reflective layer 3020 may be selectively provided even when the pixel-defining layer 3010 is not arranged.

Light generated by the first light-emitting diode unit LU1 and the third light-emitting diode unit LU3 may be reflected by the reflective layer 3020 and forwarded upward, that is, toward a user. As a result, the light efficiency of the display apparatus 3000 may be improved, and thus image quality characteristics thereof may be improved.

According to an exemplary embodiment, a cover layer CL may be disposed on the light-emitting diode structure 300, the first counter electrode FE1, and the third counter electrode FE3, and an intermediate layer 3030 may be provided between the cover layer CL and the first counter electrode FE1 and the third counter electrode FE3.

The intermediate layer 3030 may be disposed on the pixel-defining layer 3010 and the reflective layer 3020 and may protect the light-emitting diode structure 300 and the reflective layer 3020. The intermediate layer 3030 may include an inorganic material and may include a highly phototransmissive material.

The first counter electrode FE1 and the third counter electrode FE3 are disposed on the intermediate layer 3030 and are electrically connected to the second electrode TE1 of the first light-emitting diode unit LU1 and the second electrode TE3 of the third light-emitting diode unit LU3, respectively.

The cover layer CL includes an inorganic material and is disposed on the first counter electrode FE1 and the third counter electrode FE3 by using a highly phototransmissive material.

According to an exemplary embodiment, a low light transmission member OBU may be provided at least on the light-emitting diode structure 300 to overlap the light-emitting diode structure 300.

According to an exemplary embodiment, as shown in FIGS. 15 and 16, the low light transmission member OBU may have a width OBUW greater than that of the light-emitting diode structure 300 and an area larger than that of the light-emitting diode structure 300, and thus the low light transmission member OBU may completely cover the light-emitting diode structure 300.

The first counter electrode FE1 and the third counter electrode FE3 may be apart from each other. Furthermore, according to an exemplary embodiment, as shown in FIG. 7, the first counter electrode FE1 and the third counter electrode FE3 may be common to the first pixel P1 and the third pixel P3.

Furthermore, according to an exemplary embodiment, a counter electrode line FEL may be common to the four pixels P1, P2, P3, and P4. According to another exemplary embodiment, the counter electrode line FEL may be common to all pixels.

Furthermore, in another example, a cover layer CL may be disposed on the low light transmission member OBU.

According to an exemplary embodiment, although not shown, an encapsulation member (not shown) may be further arranged on the low light transmission member OBU, where the encapsulation member may include a glass, a metal, or a plastic.

Furthermore, the encapsulation member may have a structure in which one or more organic layers or inorganic layers are stacked.

The display apparatus 3000 according to the exemplary embodiment includes at least a plurality of pixels P1, P2, P3, and P4 and the light-emitting diode structure 300.

The light-emitting diode structure 300 is arranged between the plurality of pixels P1, P2, P3, and P4, where the first light-emitting diode unit LU1 corresponds to the first pixel P1, the second light-emitting diode unit LU2 corresponds to the second pixel P2, the third light-emitting diode unit LU3 corresponds to the third pixel P3, and the fourth light-emitting diode unit LU4 corresponds to the fourth pixel P4.

Light are generated by the four pixels P1, P2, P3, and P4 via the single light-emitting diode structure 300, and thus the efficiency of driving the display apparatus 3000 is increasing.

Here, the separation unit SU of the light-emitting diode structure 300 may reduce or prevent electric interference of the first light-emitting diode unit LU1, the second light-emitting diode unit LU2, the third light-emitting diode unit LU3, and the fourth light-emitting diode unit LU4 to one another. Furthermore, according to an exemplary embodiment, when the separation unit SU includes a light transmittance reducing material, e.g., a BM material, effects based on light interferences of the first light-emitting diode unit LU1, the second light-emitting diode unit LU2, the third light-emitting diode unit LU3, and the fourth light-emitting diode unit LU4 to one another may be reduced or prevented, thereby improving the light characteristics of the display apparatus 3000 and image quality characteristics thereof.

According to an exemplary embodiment, the reflective layer 3020 may be arranged. As a result, light generated by the first light-emitting diode unit LU1, the second light-emitting diode unit LU2, the third light-emitting diode unit LU3, and the fourth light-emitting diode unit LU4 may be reflected by the reflective layer 3020, and thus light efficiency of the display apparatus 3000 may be improved.

Particularly, according to the exemplary embodiment, the first light-emitting diode unit LU1, the second light-emitting diode unit LU2, the third light-emitting diode unit LU3, and the fourth light-emitting diode unit LU4 are adjacent to one another. As a result, light may be easily extracted to the first pixel P1, the second pixel P2, the third pixel P3, and the fourth pixel P4 that are arranged adjacent to one another in correspondence to the first light-emitting diode unit LU1, the second light-emitting diode unit LU2, the third light-emitting diode unit LU3, and the fourth light-emitting diode unit LU4.

Furthermore, according to an exemplary embodiment, the reflective layer 3020 may include the sloped reflective layer 3021 to reflect more light toward a user, thereby improving image quality characteristics of the display apparatus 3000.

Since the other operations and effects of the light-emitting diode structure 300 are identical to those described above in the above described exemplary embodiment, detailed descriptions thereof will be omitted.

Figure 17A:
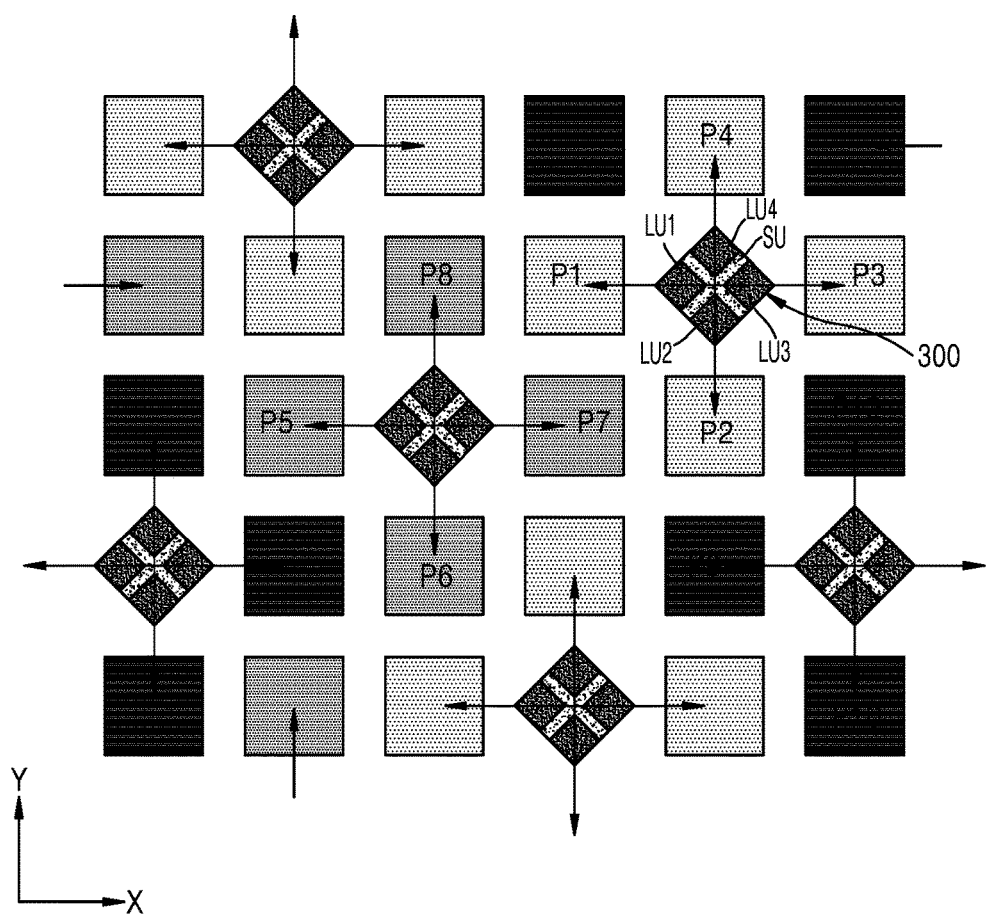
FIGS. 17A and 17B are plan views showing various exemplary embodiments of pixel arrangements in a display apparatus according to the invention.
Figure 17B:
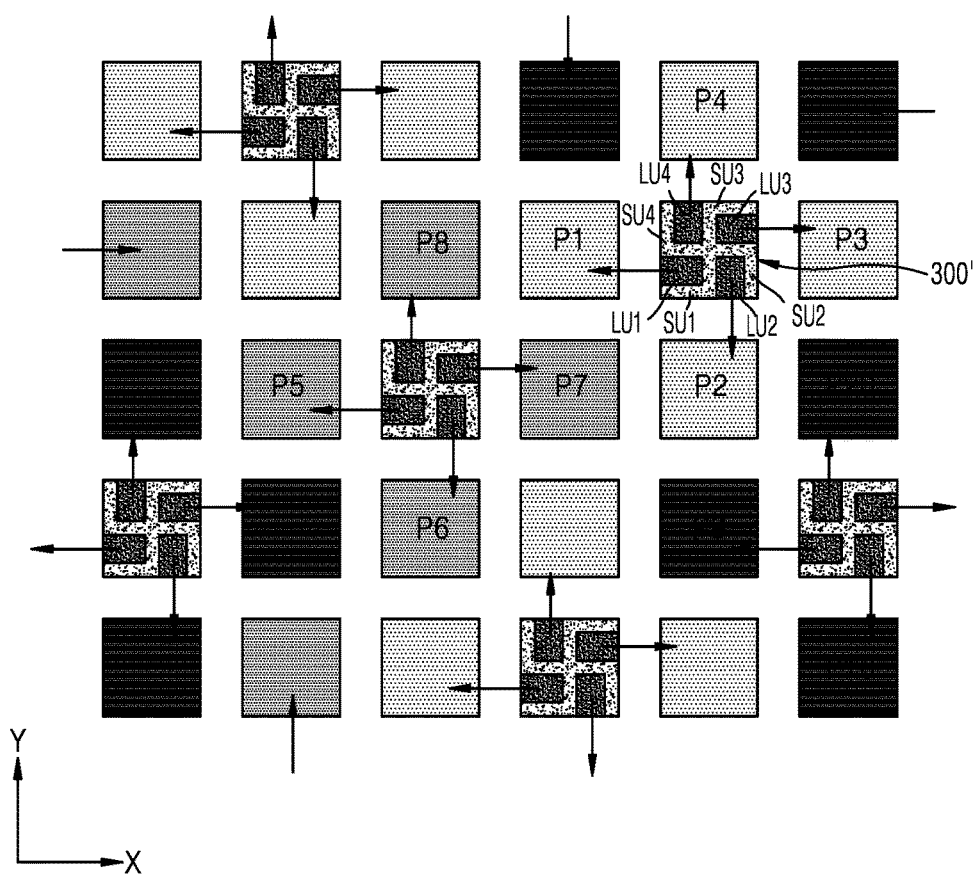

FIGS. 17A and 17B are plan views showing various examples of pixel arrangements in a display apparatus according to an exemplary embodiment.

According to an exemplary embodiment, FIGS. 17A and 17B may show pixel arrangements of the display apparatus 3000.

Referring to FIG. 17A, a first pixel P1 and a third pixel P3 are arranged adjacent to each other in a first direction, that is, the x-axis direction in FIG. 17A. A second pixel P2 and a fourth pixel P4 are arranged adjacent to each other in a second direction crossing the first direction (the x-axis direction in FIG. 17A), that is, the y-axis direction in FIG. 17A.

The light-emitting diode structure 300 may correspond to the first, second, third, and fourth pixels P1, P2, P3, and P4.

In other words, the single light-emitting diode structure 300 may be arranged in correspondence to the four pixels P1, P2, P3, and P4 adjacent to one another.

According to an exemplary embodiment, the four pixels P1, P2, P3, and P4 adjacent to one another may form a cross-like shape around the light-emitting diode structure 300.

According to an exemplary embodiment, the first, second, third, and fourth pixels P1, P2, P3, and P4 may represent light of a same first color.

Furthermore, fifth, sixth, seventh, and eighth pixels P5, P6, P7, and P8 may be adjacent to the first pixel P1 and the second pixel P2.

The fourth pixel P4 and the seventh pixel P7 are adjacent to each other in the first direction, that is, the x-axis direction in FIG. 17A. The sixth pixel P6 and the eighth pixel P8 are arranged adjacent to each other in the second direction crossing the first direction (the x-axis direction in FIG. 17A), that is, the y-axis direction in FIG. 17A.

The light-emitting diode structure 300 may correspond to the fifth, sixth, seventh, and eighth pixels P5, P6, P7, and P8.

In other words, the single light-emitting diode structure 300 may be arranged in correspondence to the four pixels P5, P6, P7, and P8 adjacent to one another.

According to an exemplary embodiment, the four pixels P1, P2, P3, and P4 adjacent to one another may form a cross-like shape around the light-emitting diode structure 300. Furthermore, the four pixels P5, P6, P7, and P8 may be arranged adjacent to the first, second, third, and fourth pixels P1, P2, P3, and P4, but may not be horizontally aligned with the first, second, third, and fourth pixels P1, P2, P3, and P4 in the first direction (the x-axis direction of FIG. 17A).

According to an exemplary embodiment, the fifth, sixth, seventh, and eighth pixels P5, P6, P7, and P8 may represent light of a same second color different from the first color embodied by the first, second, third, and fourth pixels P1, P2, P3, and P4.

Furthermore, ninth, tenth, eleventh, and twelfth pixels P9, P10, P11, and P12 may be arranged adjacent to the first, second, third, and fourth pixels P1, P2, P3, and P4 and the fifth, sixth, seventh, and eighth pixels P5, P6, P7, and P8 without being horizontally aligned with the first, second, third, and fourth pixels P1, P2, P3, and P4 and the fifth, sixth, seventh, and eighth pixels P5, P6, P7, and P8 in the first direction (the x-axis direction in FIG. 17A) and arranged adjacent to the first, second, third, and fourth pixels P1, P2, P3, and P4 and the fifth, sixth, seventh, and eighth pixels P5, P6, P7, and P8 without being horizontally aligned with the first, second, third, and fourth pixels P1, P2, P3, and P4 and the fifth, sixth, seventh, and eighth pixels P5, P6, P7, and P8 in the second direction (the y-axis direction in FIG. 17A).

Furthermore, the ninth, tenth, eleventh, and twelfth pixels P9, P10, P11, and P12 may represent a third color different from the first color embodied by the first, second, third, and fourth pixels P1, P2, P3, and P4 and the second color embodied by the fifth, sixth, seventh, and eighth pixels P5, P6, P7, and P8.

The respective pixels may be set to emit different colors by controlling first light-emitting diode units of the light-emitting diode structure 300.

Furthermore, according to an exemplary embodiment, the light-emitting diode structures 300 included in all pixels may be set to emit light of a same color, and the respective pixels may be controlled to emit light of different colors by using a color changing layer (not shown), a color changing filter (not shown), a color filter, etc.

FIG. 17B shows a modified example of the structure shown in FIG. 17A, where a light-emitting diode structure 300' is slightly different from the light-emitting diode structure 300. In detail, locations of respective light-emitting diode units LU1, LU2, LU3, and LU4 corresponding to first, second, third, and fourth pixels P1, P2, P3, and P4 in the light-emitting diode structure 300' are slightly different from those in the light-emitting diode structure 300 of FIG. 17A.

Furthermore, a separation unit SU of the light-emitting diode structure 300' is different from the separation unit SU of the light-emitting diode structure 300. In detail, compared to that of the light-emitting diode structure 300, the separation unit SU of the light-emitting diode structure 300' further includes a first, second, third, and fourth partitioning walls SU1, SU2, SU3, and SU4.

A side surface of side surfaces of the first light-emitting diode unit LU1 of the light-emitting diode structure 300' may correspond to the first pixel P1, and another side surface adjacent thereto may correspond to the second pixel P2. The first partitioning wall SU1 may be arranged on the side surface of the first light-emitting diode unit LU1 corresponding to the second pixel P2. Therefore, effects of light generated by the first light-emitting diode unit LU1 to the second pixel P2 may be reduced or prevented, and light may be mainly extracted in a direction toward the first pixel P1 (the direction indicated by an arrow).

A side surface of side surfaces of the second light-emitting diode unit LU2 of the light-emitting diode structure 300' may correspond to the second pixel P2, and another side surface adjacent thereto may correspond to the third pixel P3. The second partitioning wall SU2 may be arranged on the side surface of the second light-emitting diode unit LU2 corresponding to the third pixel P3. Therefore, effects of light generated by the second light-emitting diode unit LU2 to the third pixel P3 may be reduced or prevented, and light may be mainly extracted in a direction toward the second pixel P2 (the direction indicated by an arrow).

A side surface of side surfaces of the third light-emitting diode unit LU3 of the light-emitting diode structure 300' may correspond to the third pixel P3, and another side surface adjacent thereto may correspond to the fourth pixel P4. The third partitioning wall SU4 may be arranged on the side surface of the third light-emitting diode unit LU3 corresponding to the fourth pixel P4. Therefore, effects of light generated by the third light-emitting diode unit LU3 to the fourth pixel P4 may be reduced or prevented, and light may be mainly extracted in a direction toward the third pixel P3 (the direction indicated by an arrow).

A side surface of side surfaces of the fourth light-emitting diode unit LU4 of the light-emitting diode structure 300' may correspond to the fourth pixel P4, and another side surface adjacent thereto may correspond to the first pixel P1. The third partitioning wall SU4 may be arranged on the side surface of the fourth light-emitting diode unit LU4 corresponding to the first pixel P1. Therefore, effects of light generated by the fourth light-emitting diode unit LU4 to the first pixel P1 may be reduced or prevented, and light may be mainly extracted in a direction toward the fourth pixel P4 (the direction indicated by an arrow).

Figure 18:
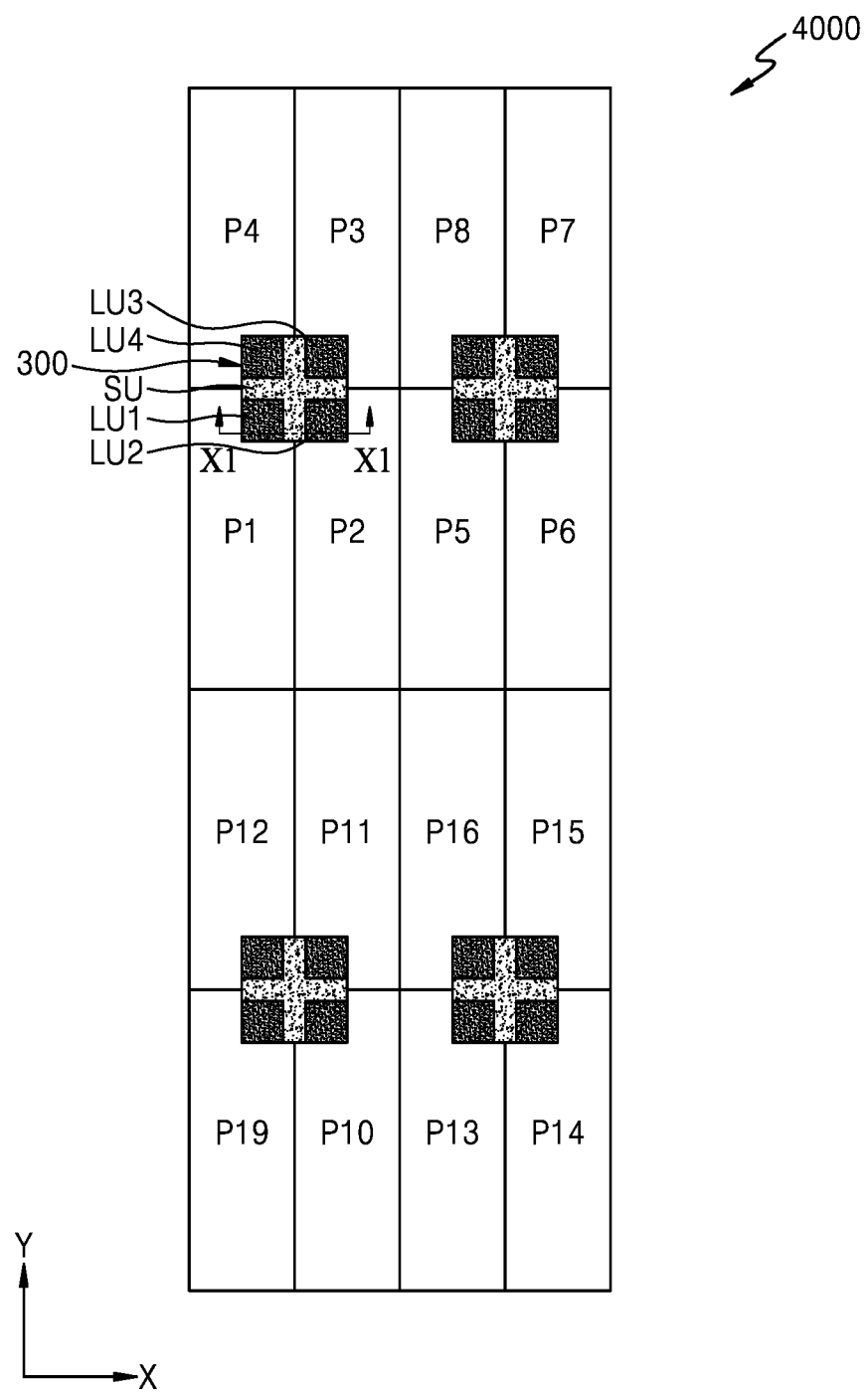
FIG. 18 is a plan view of another exemplary embodiment of a display apparatus according to the invention.
Figure 19:
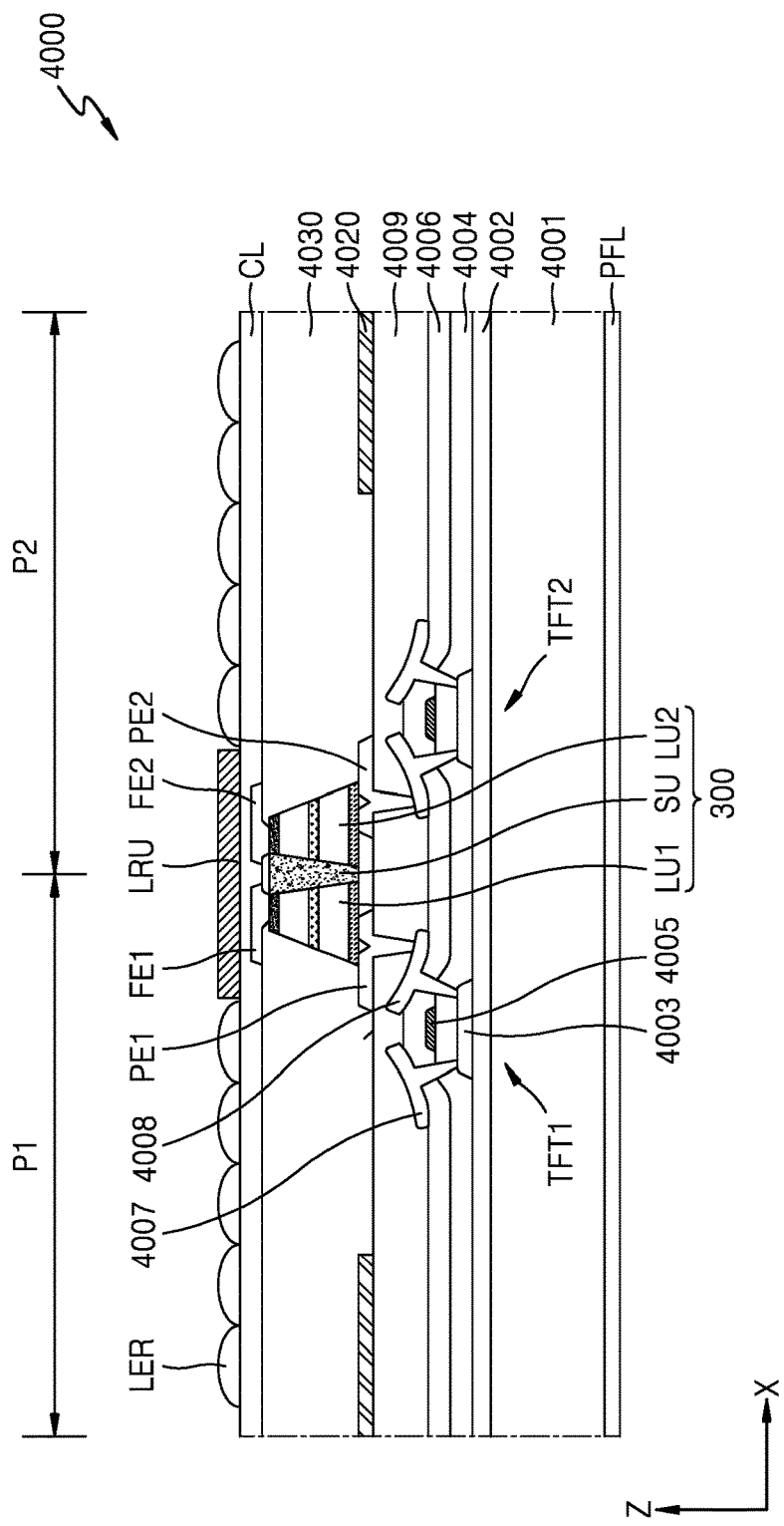
FIG. 19 is a sectional view that is obtained along line XI-XI of FIG. 18.

FIG. 18 is a plan view of a display apparatus according to another exemplary embodiment, and FIG. 19 is a sectional view that is obtained along line XI-XI of FIG. 18.

A display apparatus 4000 according to the exemplary embodiment includes a plurality of pixels arranged on a substrate 4001. A user may recognize one or more images via the pixels.

Furthermore, the display apparatus 4000 may include the pixels and one or more light-emitting diode structures 300.

Since the light-emitting diode structure 300 is identical to the light-emitting diode structure 300 of FIG. 12, as described above, detailed descriptions thereof will be omitted.

Referring to FIG. 18, the first, second, third, and fourth pixels P1, P2, P3, and P4 are adjacent to one another. In other words, the first pixel P1 and the second pixel P2 are adjacent to each other in a first direction (the x-axis direction of FIG. 18). The second pixel P2 and the third pixel P3 are adjacent to each other in a second direction (the y-axis direction of FIG. 18), which crosses the first direction (the x-axis direction of FIG. 18). Furthermore, the third pixel P3 and the fourth pixel P4 are adjacent to each other in the first direction (the x-axis direction of FIG. 18). The fourth pixel P4 and the first pixel P1 are adjacent to each other in the second direction (the y-axis direction of FIG. 18), which crosses the first direction (the x-axis direction of FIG. 18).

The light-emitting diode structure 300 may correspond to the first pixel P1, the second pixel P2, the third pixel P3, and the fourth pixel P4.

In other words, the single light-emitting diode structure 300 may be arranged in correspondence to the four pixels P1, P2, P3, and P4 adjacent to one another.

According to an exemplary embodiment, the four pixels P1, P2, P3, and P4 adjacent to one another may form a rectangle-like shape around the light-emitting diode structure 300.

Furthermore, the light-emitting diode structure 300 may include a first light-emitting diode unit LU1, a second light-emitting diode unit LU2, a third light-emitting diode unit LU3, and a fourth light-emitting diode unit LU4, and the first light-emitting diode unit LU1, the second light-emitting diode unit LU2, the third light-emitting diode unit LU3, and the fourth light-emitting diode unit LU4 may correspond to the first pixel P1, the second pixel P2, the third pixel P3, and the fourth pixel P4, respectively.

Furthermore, each of the first pixel P1 and the second pixel P2 includes at least one TFT.

Detailed descriptions thereof will be given below with reference to FIG. 19. For convenience of explanation, the below descriptions are given in relation to the first pixel P1 and the second pixel P2. Since each of the third pixel P3 and the fourth pixel P4 may include one or more thin-film transistors and may have a substantially same configuration as that of the first pixel P1 and the second pixel P2, detailed descriptions thereof will be omitted.

Referring to FIG. 19, the first pixel P1 includes a first thin-film transistor TFT1, whereas the second pixel P2 includes a second thin-film transistor TFT2.

The first thin-film transistor TFT1 of the first pixel P1 may be electrically connected to the first light-emitting diode unit LU1, whereas the second thin-film transistor TFT2 of the second pixel P2 may be electrically connected to the second light-emitting diode unit LU2.

Each of the first thin-film transistor TFT1 and the second thin-film transistor TFT2 may include an active layer 4003, a gate electrode 4005, a source electrode 4007, and a drain electrode 4008. Since the first thin-film transistor TFT1 and the second thin-film transistor TFT2 are identical or similar to those of the display apparatus 1000 according to the above described exemplary embodiment, detailed descriptions thereof will be omitted.

Furthermore, since a bottom protection layer PFL and a buffer layer 4002 according to an exemplary embodiment are identical to those in the above described exemplary embodiment, detailed descriptions thereof will be omitted.

Furthermore, since a gate insulation layer 4004, an interlayer dielectric 4006, and a passivation layer 4009 according to an exemplary embodiment are identical to those in the above described exemplary embodiment, detailed descriptions thereof will be omitted.

As described above in the above described exemplary embodiment, a first pixel electrode PE1 and a second pixel electrode PE2 may be disposed on the passivation layer 4009 and may be connected to either the source electrode 4007 or the drain electrode 4008, e.g., the drain electrode 4008.

The light-emitting diode structure 300 is disposed on the passivation layer 4009.

The first light-emitting diode unit LU1 of the light-emitting diode structure 300 is electrically connected to the first thin-film transistor TFT1. In detail, the first electrode BE1 of the first light-emitting diode unit LU1 may be electrically connected to the first pixel electrode PE1, and thus the first thin-film transistor TFT1 may be electrically connected to the first light-emitting diode unit LU1.

The second light-emitting diode unit LU2 of the light-emitting diode structure 300 is electrically connected to the second thin-film transistor TFT2. In detail, the first electrode BE2 of the second light-emitting diode unit LU2 may be electrically connected to the second pixel electrode PE2, and thus the second thin-film transistor TFT2 may be electrically connected to the second light-emitting diode unit LU2.

A first counter electrode FE1 and a second counter electrode FE2 are arranged to respectively face the first pixel electrode PE1 and the second pixel electrode PE2 and are respectively electrically connected to the first light-emitting diode unit LU1 and the second light-emitting diode unit LU2 of the light-emitting diode structure 100.

In detail, the first counter electrode FE1 and the second counter electrode FE2 are electrically connected to the second electrode TE1 of the first light-emitting diode unit LU1 and the second electrode TE2 of the second light-emitting diode unit LU2, respectively.

According to an exemplary embodiment, a reflective layer 4020 may be provided around the light-emitting diode structure 300. In an exemplary embodiment, the reflective layer 4020 may be disposed on the passivation layer 4009, for example.

Although not shown, according to an exemplary embodiment, a pixel-defining layer (not shown) may be disposed on the passivation layer 4009 as in the above described exemplary embodiment. An opening corresponding to the first pixel P1, the second pixel P2, the third pixel P3, and the fourth pixel P4 may be defined in the pixel-defining layer.

Although not shown, the reflective layer 4020 may be disposed on the pixel-defining layer.

According to an exemplary embodiment, a cover layer CL may be disposed on the light-emitting diode structure 300, the first counter electrode FE1, and the second counter electrode FE2, and an intermediate layer 4030 may be provided between the cover layer CL and the first counter electrode FE1 and the second counter electrode FE2.

The intermediate layer 4030 may protect the light-emitting diode structure 300 and the reflective layer 4020. The intermediate layer 4030 may include an insulation material and may include a highly phototransmissive material.

The first counter electrode FE1 and the second counter electrode FE2 are disposed on the intermediate layer 4030 and are electrically connected to the second electrode TE1 of the first light-emitting diode unit LU1 and the second electrode TE2 of the second light-emitting diode unit LU2, respectively.

The cover layer CL includes an inorganic material and is disposed on the first counter electrode FE1 and the second counter electrode FE2 by using a highly phototransmissive material.

According to an exemplary embodiment, a reflective member LRU may be provided at least on the light-emitting diode structure 300 to overlap the light-emitting diode structure 300.

Furthermore, according to an exemplary embodiment, the reflective member LRU may be selectively applied to the display apparatuses 1000, 2000, and 3000 described above, where low light transmission members OBU may be omitted in the display apparatuses 1000, 2000, and 3000. Furthermore, according to an exemplary embodiment, the display apparatus 4000 according to the exemplary embodiment may include a low light transmission member OBU instead of the reflective member LRU.

The reflective member LRU may be provided at least on the light-emitting diode structure 300 to overlap the light-emitting diode structure 300. According to an exemplary embodiment, the reflective member LRU may have a width greater than that of the light-emitting diode structure 300 and an area larger than that of the light-emitting diode structure 300, and thus the reflective member LRU may completely cover the light-emitting diode structure 300.

The display apparatus 4000 may further include one or more light controlling members LER in correspondence to the pixels P1 and P2. According to an exemplary embodiment, the light controlling member LER may not overlap the light-emitting diode structure 300.

According to an exemplary embodiment, the light controlling member LER may be disposed on the cover layer CL.

Although not shown, the light controlling member LER may be selectively applied to the display apparatuses 1000, 2000, and 3000 according to the above described exemplary embodiments.

The light controlling member LER may have one of various shapes. In an exemplary embodiment, the light controlling member LER may have a lens-like shape, and decrease light ununiformity, for example.

To this end, the light controlling member LER may have not only a convex lens-like shape, but also various other shapes, such as a concave lens-like shape, a teardrop-like shape, a cone-like shape, or a curved shape.

The first counter electrode FE1 and the second counter electrode FE2 may be apart from each other. Furthermore, according to an exemplary embodiment, as shown in FIG. 7, the first counter electrode FE1 and the second counter electrode FE2 may be common to the first pixel P1 and the second pixel P2.

Furthermore, according to an exemplary embodiment, a counter electrode line FEL may be common to the four pixels P1, P2, P3, and P4. According to another exemplary embodiment, the counter electrode line FEL may be common to all pixels.

Furthermore, according to an exemplary embodiment, a cover layer CL may be disposed on the reflective member LRU.

According to an exemplary embodiment, although not shown, an encapsulation member (not shown) may be further arranged on the reflective member LRU, where the encapsulation member may include a glass, a metal, or a plastic.

Furthermore, the encapsulation member may have a structure in which one or more organic layers or inorganic layers are stacked.

The display apparatus 4000 according to the exemplary embodiment includes at least a plurality of pixels P1, P2, P3, and P4 and the light-emitting diode structure 300.

The light-emitting diode structure 300 is arranged between the plurality of pixels P1 and P2, where the first light-emitting diode unit LU1 corresponds to the first pixel P1, the second light-emitting diode unit LU2 corresponds to the second pixel P2, the third light-emitting diode unit LU3 corresponds to the third pixel P3, and the fourth light-emitting diode unit LU4 corresponds to the fourth pixel P4.

Light are generated by the four pixels P1, P2, P3, and P4 via the single light-emitting diode structure 300, and thus the efficiency of driving the display apparatus 4000 is increasing.

Here, the separation unit SU of the light-emitting diode structure 300 may reduce or prevent electric interference of the first light-emitting diode unit LU1, the second light-emitting diode unit LU2, the third light-emitting diode unit LU3, and the fourth light-emitting diode unit LU4 to one another. Furthermore, according to an exemplary embodiment, when the separation unit SU includes a light transmittance reducing material, e.g., a BM material, effects based on light interferences of the first light-emitting diode unit LU1, the second light-emitting diode unit LU2, the third light-emitting diode unit LU3, and the fourth light-emitting diode unit LU4 to one another may be reduced or prevented, thereby improving the light characteristics of the display apparatus 4000 and image quality characteristics thereof.

According to an exemplary embodiment, the reflective layer 4020 may be arranged. As a result, light generated by the first light-emitting diode unit LU1, the second light-emitting diode unit LU2, the third light-emitting diode unit LU3, and the fourth light-emitting diode unit LU4 may be reflected by the reflective layer 4020, and thus light efficiency of the display apparatus 4000 may be improved.

Furthermore, by using the light controlling member LER, light extraction toward a user may be improved and light uniformity may be improved, and thus image quality characteristics of the display apparatus 4000 may be improved.

Figure 20A:
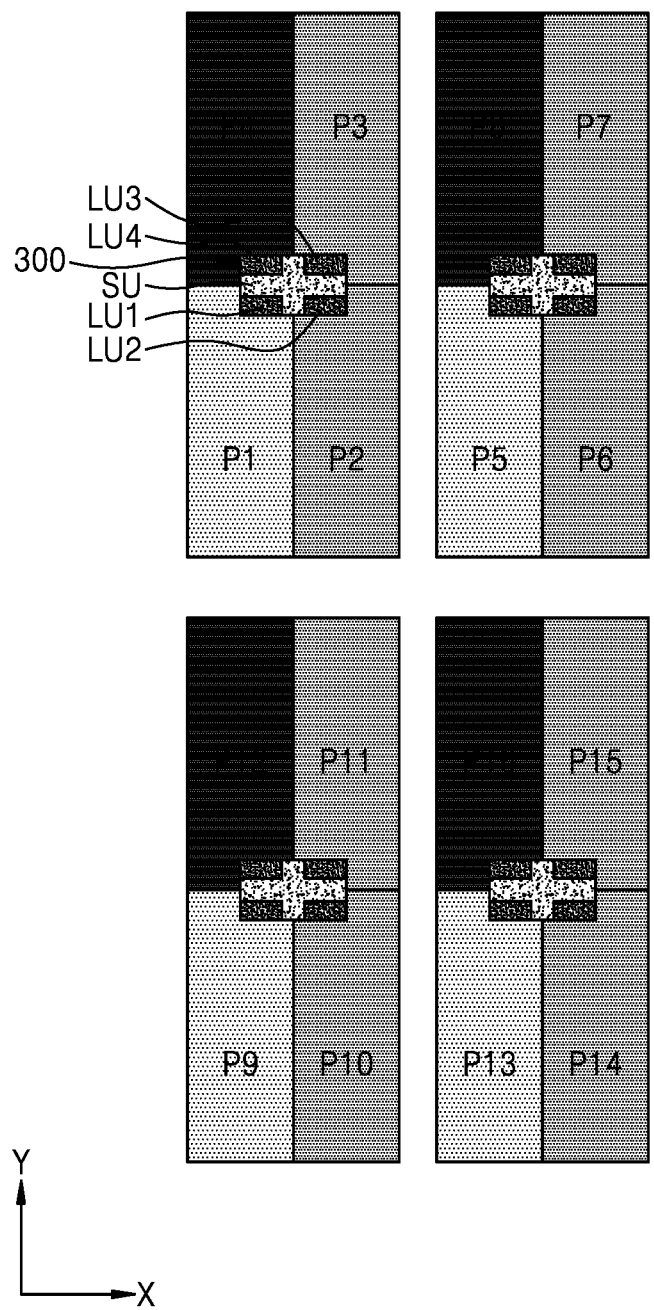
FIGS. 20A and 20B are plan views showing various exemplary embodiments of pixel arrangements in a display apparatus according to the invention.
Figure 20B:
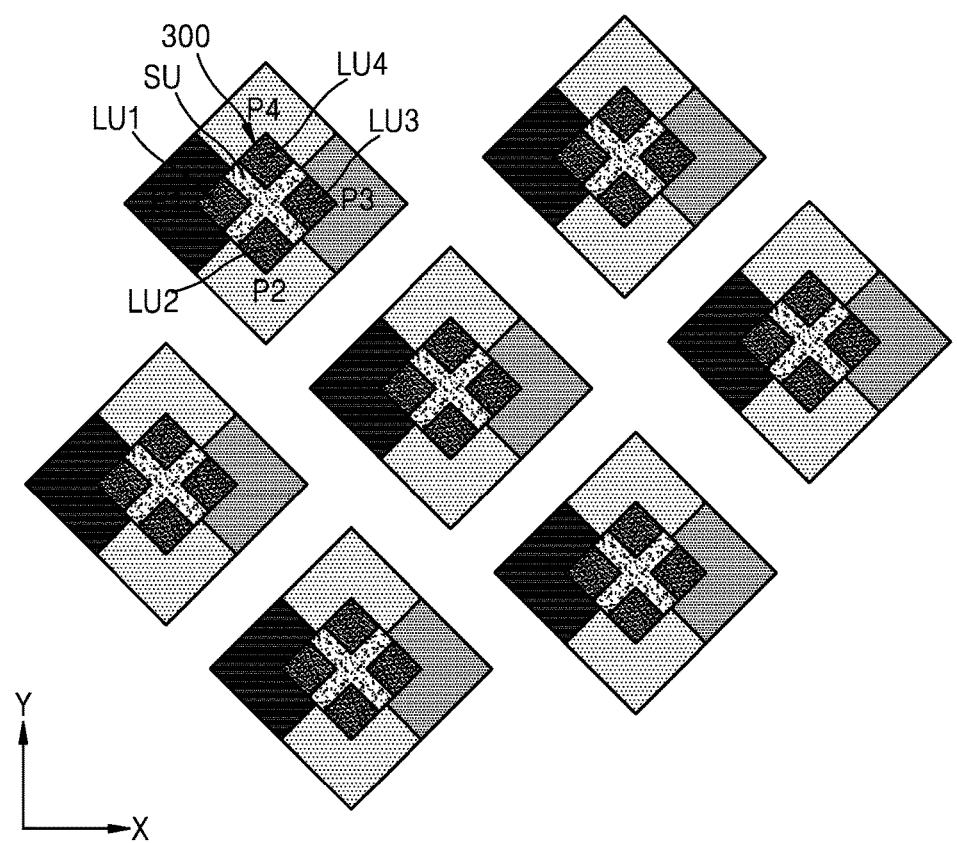

FIGS. 20A and 20B are plan views showing various examples of pixel arrangements in a display apparatus according to an exemplary embodiment.

Referring to FIG. 20A, four pixels P1, P2, P3, and P4 are adjacent to one another. The first pixel P1 and the second pixel P2 are arranged adjacent to each other in a first direction (the x-axis direction in FIG. 20A). The second pixel P2 and the third pixel P3 are arranged adjacent to each other in a second direction crossing the first direction (the y-axis direction in FIG. 20A). Furthermore, the third pixel P3 and the fourth pixel P4 are arranged adjacent to each other in the first direction (the x-axis direction in FIG. 20A). The fourth pixel P4 and the first pixel P1 are arranged adjacent to each other in the second direction crossing the first direction (the y-axis direction in FIG. 20A). The light-emitting diode structure 300 may correspond to the first pixel P1, the second pixel P2, the third pixel P3, and the fourth pixel P4.

In other words, the single light-emitting diode structure 300 may be arranged in correspondence to the four pixels P1, P2, P3, and P4 adjacent to one another.

According to an exemplary embodiment, the four pixels P1, P2, P3, and P4 adjacent to one another may form a rectangle-like shape around the light-emitting diode structure 300.

According to an exemplary embodiment, the first pixel P1 may represent light of a first color. The second pixel P2 and the third pixel P3 may represent light of a same second color, which is different from the first color embodied by the first pixel P1. The fourth pixel P4 may represent light of a third color, which is different from the first color embodied by the first pixel P1 and the second color embodied by the second pixel P2 and the third pixel P3.

Furthermore, fifth, sixth, seventh, and eighth pixels P5, P6, P7, and P8 may be adjacent to the first, second, third, and fourth pixels P1, P2, P3, and P4. In detail, the fifth, sixth, seventh, and eighth pixels P5, P6, P7, and P8 may be adjacent to the first, second, third, and fourth pixels P1, P2, P3, and P4 in the first direction (the x-axis direction in FIG. 20A).

The fifth, sixth, seventh, and eighth pixels P5, P6, P7, and P8 may represent light of same colors as those of the first, second, third, and fourth pixels P1, P2, P3, and P4, respectively.

Furthermore, ninth, tenth, eleventh, and twelfth pixels P9, P10, P11, and P12 may be adjacent to the first, second, third, and fourth pixels P1, P2, P3, and P4. In detail, the ninth, tenth, eleventh, and twelfth pixels P9, P10, P11, and P12 may be adjacent to the first, second, third, and fourth pixels P1, P2, P3, and P4 in the second direction (the y-axis direction of FIG. 20A), which crosses the first direction (the x-axis direction of FIG. 20A).

The ninth, tenth, eleventh, and twelfth pixels P9, P10, P11, and P12 may represent light of same colors as those of the first, second, third, and fourth pixels P1, P2, P3, and P4, respectively.

Furthermore, thirteenth, fourteenth, fifteenth, and sixteenth pixels P13, P14, P15, and P16 may be adjacent to the ninth, tenth, eleventh, and twelfth pixels P9, P10, P11, and P12. In detail, the thirteenth, fourteenth, fifteenth, and sixteenth pixels P13, P14, P15, and P16 may be adjacent to the ninth, tenth, eleventh, and twelfth pixels P9, P10, P11, and P12 in the first direction (the x-axis direction of FIG. 20A).

The thirteenth, fourteenth, fifteenth, and sixteenth pixels P13, P14, P15, and P16 may represent light of same colors as those of the first, second, third, and fourth pixels P1, P2, P3, and P4, respectively.

The respective pixels may be set to emit different colors by controlling first light-emitting diode units of the light-emitting diode structure 300.

Furthermore, according to an exemplary embodiment, the light-emitting diode structures 300 included in all pixels may be set to emit light of a same color, and the respective pixels may be controlled to emit light of different colors by using a color changing layer (not shown), a color changing filter (not shown), a color filter, etc.

Referring to FIG. 20B, the arrangement of pixels and a light-emitting diode is similar to that of FIG. 20A. In other words, the first, second, third, and fourth pixels P1, P2, P3, and P4 are adjacent to one another. Furthermore, the single light-emitting diode structure 300 may be arranged in correspondence to the four pixels P1, P2, P3, and P4 adjacent to one another.

Furthermore, other four pixels may be adjacent to one another, and a single light-emitting diode structure 300 may be arranged in correspondence to the four pixels adjacent to one another.

The four pixels around the single light-emitting diode structure 300 may be adjacent to the first, second, third, and fourth pixels P1, P2, P3, and P4 not in the first direction (the y-axis direction) and the second direction (the x-axis direction), but in a third direction tilted by an angle smaller than or greater than 90 degrees with respect to the first direction (the y-axis direction) and the second direction (the x-axis direction).

Compared to FIG. 20A, the first, second, third, and fourth pixels P1, P2, P3, and P4 are adjacent to one another not in the first direction (the y-axis direction) and the second direction (the x-axis direction), but in the third direction tilted by an angle smaller than or greater than 90 degrees with respect to the first direction (the y-axis direction) and the second direction (the x-axis direction).

The first direction, the second direction, and the third direction in FIGS. 20A and 20B may be defined variously. In other words, the first direction, the second direction, and the third direction may be defined by edges of a display apparatus. Furthermore, according to an exemplary embodiment, the first direction, the second direction, and the third direction in FIGS. 20A and 20B may be directions based on the eyes of a user while the user is using a display apparatus.

Furthermore, according to an exemplary embodiment, the first pixel P1 may represent light of a first color, whereas the second pixel P2 and the fourth pixel P4 may represent light of a second color different from the first color. The third pixel P3 may represent light of a third color, which is different from the first color embodied by the first pixel P1 and the second color embodied by the second pixel P2 and the fourth pixel P4.

Based on various cell arrangements described above, a display apparatus that satisfies user convenience demands and satisfies various purposes and image quality characteristics thereof may be embodied.

As described above, according to the one or more of the above exemplary embodiments, light-emitting diode structures and display apparatuses according to exemplary embodiments may provide light-emitting diode structures with improved light characteristics, image quality characteristics, and manufacturing convenience and display apparatuses including the same.

It should be understood that exemplary embodiments described herein should be considered in a descriptive sense only and not for purposes of limitation. Descriptions of features or exemplary embodiments within each exemplary embodiment should typically be considered as available for other similar features or exemplary embodiments in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A light-emitting diode structure comprising:
a plurality of light-emitting diode units; and
a separation unit,
wherein
at least one of the plurality of light-emitting diode units comprises:
a stacked structure including an n-type semiconductor layer, a p-type semiconductor layer, and a photoactive layer arranged between the n-type semiconductor layer and the p-type semiconductor layer;
a first electrode, which faces a surface of the stacked structure and is electrically connected to one of the n-type semiconductor layer and the p-type semiconductor layer; and
a second electrode, which faces the surface of the stacked structure opposite to the surface faced by the first electrode and is electrically connected to one of the n-type semiconductor layer and the p-type semiconductor layer, and
the separation unit is arranged between at least two adjacent light-emitting diode units among the plurality of light-emitting diode units and separates the two light-emitting diode units from each other,
the two adjacent light-emitting diode units among the plurality of light-emitting diode units are adjacent to each other at least in a first direction, and
the light-emitting diode structure emits light from side surfaces facing the first direction or a second direction crossing the first direction among the plurality of side surfaces arranged between the first electrode and the second electrode.

2. The light-emitting diode structure of claim 1, the plurality of light-emitting diode units emit light from at least one side surfaces among a plurality of side surfaces arranged between the first electrode and the second electrode.

3. The light-emitting diode structure of claim 1, wherein the separation unit further comprises at least one partitioning walls corresponding to at least one side surface among side surfaces of the plurality of light-emitting diode structure.

4. The light-emitting diode structure of claim 1, wherein the plurality of light-emitting diode units further comprise two adjacent light-emitting diode units in the first direction and two adjacent light-emitting diode units in the second direction crossing the first direction.

5. A display apparatus comprising:
a plurality of pixels; and
at least one light-emitting diode structures,
wherein at least one of the at least one light-emitting diode structures is arranged in correspondence at least to the plurality of pixels adjacent to one another,
the at least one of the at least one light-emitting diode structures comprises a plurality of light-emitting diode units and a separation unit,
each of the plurality of light-emitting diode units comprises:
a stacked structure including an n-type semiconductor layer, a p-type semiconductor layer, and a photoactive layer arranged between the n-type semiconductor layer and the p-type semiconductor layer;
a first electrode, which faces a surface of the stacked structure and is electrically connected to one of the n-type semiconductor layer and the p-type semiconductor layer; and
a second electrode, which faces the surface of the stacked structure opposite to the surface faced by the first electrode and is electrically connected to one of the n-type semiconductor layer and the p-type semiconductor layer, and
the separation unit is arranged between at least two adjacent light-emitting diode units among the plurality of light-emitting diode units and separates the two light-emitting diode units from each other,
the two adjacent light-emitting diode units among the plurality of light-emitting diode units are adjacent to each other at least in a first direction, and the light-emitting diode structure emits light from side surfaces facing the first direction or a second direction crossing the first direction among the plurality of side surfaces arranged between the first electrode and the second electrode.

6. The display apparatus of claim 5, wherein the plurality of light-emitting diode units is arranged in correspondence to the plurality of pixels adjacent to one another, respectively.

7. The display apparatus of claim 5, wherein the plurality of light-emitting diode units of the light-emitting diode structure comprises at least two light-emitting diode units adjacent to each other in the first direction, and two pixels among the plurality of pixels corresponding to the light-emitting diode units adjacent to each other in the first direction are adjacent to each other in the first direction.

8. The display apparatus of claim 5, wherein the plurality of light-emitting diode units of the light-emitting diode structure comprises light-emitting diode units adjacent to each other in the first direction, and pixels among the plurality of pixels corresponding to the light-emitting diode units adjacent to each other in the first direction are adjacent to each other in the second direction crossing the first direction.

9. The display apparatus of claim 5, wherein each of the plurality of pixels comprises at least one thin-film transistor, and each of the light-emitting diode units of the light-emitting diode structure is electrically connected to the thin-film transistor.

10. The display apparatus of claim 9, wherein each of the plurality of pixels comprises a pixel electrode which electrically interconnects the thin-film transistor and each of the light-emitting diode unit of the light-emitting diode structure and a counter electrode electrically connected to each of the light-emitting diodes of the light-emitting diode structure.

11. The display apparatus of claim 5, further comprising a reflective layer, which is arranged in correspondence to the plurality of pixels and reflects light emitted by the light-emitting diode units.

12. The display apparatus of claim 11, wherein the reflective layer comprises a sloped reflective layer.

13. The display apparatus of claim 12, wherein the opening of the pixel-defining layer is arranged at least in correspondence to the plurality of pixels, and the light-emitting diode structure is arranged in correspondence to the opening.

14. The display apparatus of claim 5, further comprising a pixel-defining layer in which an opening corresponding to the plurality of pixels is defined, and which includes an insulation material.

15. The display apparatus of claim 5, further comprising a light controlling member, which is arranged in correspondence to the plurality of pixels and controls light emitted by the light-emitting diode units.

16. The display apparatus of claim 5, wherein the plurality of light-emitting diode units further comprises two adjacent light-emitting diode units in the first direction and two adjacent light-emitting diode units in the second direction crossing the first direction, and the plurality of pixels comprises two pixels, which correspond to the two adjacent light-emitting diode units in the first direction and are adjacent to each other, and two pixels, which correspond to the two adjacent light-emitting diode units in the second direction and are adjacent to each other.

17. The display apparatus of claim 5, wherein the plurality of light-emitting diode units emits light from at least one side surfaces among a plurality of side surfaces arranged between the first electrode and the second electrode.

18. The display apparatus of claim 5, wherein the separation unit further comprises at least one partitioning walls corresponding to at least one side surface among side surfaces of the plurality of light-emitting diode structure.

* * * * *